(12) United States Patent
Giannuzzi

(10) Patent No.: US 10,801,926 B2
(45) Date of Patent: Oct. 13, 2020

(54) PROBE WITH SOLID BEVELED TIP AND METHOD FOR USING SAME FOR SPECIMEN EXTRACTION

(71) Applicant: EXpressLO LLC, Lehigh Acres, FL (US)

(72) Inventor: Lucille A. Giannuzzi, Fort Myers, FL (US)

(73) Assignee: EXpressLO LLC, Lehigh Acres, FL (US)

(*) Notice: Subject to any disclaimer, the term of this patent is extended or adjusted under 35 U.S.C. 154(b) by 214 days.

(21) Appl. No.: 16/033,600

(22) Filed: Jul. 12, 2018

(65) Prior Publication Data

US 2019/0017904 A1    Jan. 17, 2019

Related U.S. Application Data

(60) Provisional application No. 62/533,468, filed on Jul. 17, 2017.

(51) Int. Cl.
*G01N 1/06* (2006.01)
*G01N 1/08* (2006.01)
(Continued)

(52) U.S. Cl.
CPC ............ *G01N 1/06* (2013.01); *G01N 1/08* (2013.01); *H01J 37/20* (2013.01); *G01N 1/28* (2013.01);
(Continued)

(58) Field of Classification Search
CPC .. G01N 1/06; G01N 1/08; G01N 1/28; G01N 2001/061; G01N 21/085; G01N 1/286;
(Continued)

(56) References Cited

U.S. PATENT DOCUMENTS 5,461,907 A * 10/1995 Tench .................... G01Q 60/38
73/105
6,420,722 B2    7/2002 Moore et al.
(Continued)

FOREIGN PATENT DOCUMENTS

KR         2016071527      *  6/2016

OTHER PUBLICATIONS

Giannuzzi et al., Microsc. Microanal. 21, 1034-1048, 2015.

*Primary Examiner* — Robert R Raevis
(74) *Attorney, Agent, or Firm* — Schaffer IP Law, LLC

(57) ABSTRACT

A probe includes a solid elongate body disposed along a long axis of the probe and terminating in a probe tip, and a solid planar beveled surface at or adjacent an end of the probe tip formed at a non-zero beveled angle relative to a normal of the long axis of the probe, The solid planar beveled surface is configured to impart Van der Waals attractive force to a sample surface positioned immediately adjacent the solid beveled surface of the probe so that the sample can be detached from and lifted from the bulk material and transported to a grid for investigation. Various embodiments of the beveled surface are described, including an elliptical probe tip surface beveled between 10 and 45 degrees to the normal to the probe long axis and planar surfaces formed in the sides of the probe body that are parallel to the probe long axis.

16 Claims, 29 Drawing Sheets

(51) Int. Cl.
*H01J 37/20* (2006.01)
*G01N 1/28* (2006.01)
*H01J 37/26* (2006.01)

(52) U.S. Cl.
CPC ......... *H01J 37/26* (2013.01); *H01J 2237/208* (2013.01); *H01J 2237/28* (2013.01); *H01J 2237/31745* (2013.01)

(58) Field of Classification Search
CPC .. G01N 2001/2873; G01N 1/31; G01N 1/312; H01J 37/20; H01J 2237/28; H01J 37/26; H01J 2237/31745
USPC ................... 73/104, 863, 866, 866.5, 432.1; 250/440.11–443.1, 306–311, 341.2, 250/339.11, 339.12, 340–342
See application file for complete search history.

(56) References Cited

U.S. PATENT DOCUMENTS

| | | |
|---|---|---|
| 6,570,170 B2 | 5/2003 | Moore et al. |
| 7,041,985 B1 | 5/2006 | Wang et al. |
| 8,134,124 B2 | 3/2012 | Blackwood et al. |
| 8,357,913 B2 | 1/2013 | Agorio et al. |
| 8,455,821 B2 | 6/2013 | Arjavac et al. |
| 8,525,137 B2 | 9/2013 | Blackwood et al. |
| 8,740,209 B2 | 6/2014 | Giannuzzi |
| 8,789,826 B2 | 7/2014 | Giannuzzi |
| 8,884,247 B2 | 11/2014 | Miller et al. |
| 8,890,064 B2 | 11/2014 | Arjavac et al. |
| 9,275,831 B2 | 3/2016 | Arjavac et al. |
| 2010/0032581 A1 | 2/2010 | Grosse et al. |
| 2015/0001176 A1* | 1/2015 | Young ..................... G01N 1/32 216/37 |

* cited by examiner

PROBE WITH SOLID BEVELED TIP AND METHOD FOR USING SAME FOR SPECIMEN EXTRACTION

CROSS-REFERENCES TO RELATED APPLICATIONS

This application claims the benefit of U.S. Provisional Patent Application No. 62/533,468, filed Jul. 17, 2017, whose contents are incorporated herein for all purposes.

BACKGROUND OF THE INVENTION

Field of the Invention

This invention relates generally to the field of focused ion beam milling of specimens for subsequent electron microscopic examination and, more particularly, to detailed methods for creating site-specific specimens using either a charged particle focused ion beam instrument or via laser ablation and the subsequent manipulation of the created specimens performed generally independently of the instrument that created the specimens.

Description of the Prior Art

The ex situ lift-out (EXLO) method is a well-known technique that is typically used to prepare specimens for subsequent transmission electron microscope (TEM) or other analysis using site-specific focused ion beam (FIB) milling routines. In this method, specimens are completely FIB milled free inside of a charged particle vacuum environment and then the specimen is manipulated to a carbon, holey carbon, or formvar coated TEM grid using a light optical microscope and micromanipulator system on a motorized sample stage in ambient conditions outside of the FIB. The advantages to the EXLO method for FIB specimens are: (i) EXLO requires little or no initial specimen preparation, (ii) it is site-specific, (iii) it is fast and easy, and (iv) it has a high success rate. The primary disadvantages to the original or conventional EXLO technique are: (i) it is difficult and/or impossible to further thin the specimen, (ii) it is difficult and/or impossible to perform back-side milling on a specimen to avoid curtaining artifacts, and (iii) the carbon or formvar support film may inhibit certain analyses or cleaning operations.

Manipulation in ambient conditions of the specimen to the grid may be performed by different probing methods. One conventional method utilizes what is now understood to be Van der Waals attraction as shown in FIG. 1 by touching the small tip but primarily the outer frustoconical or curved side surface of a glass needle 104 to the specimen 103 contained within FIB milled trench walls 102 below the sample surface 101. As illustrated in FIG. 2 showing a smaller portion 201 of an entire 3 mm diameter grid, the specimen 103 attached to the probe 104 may be transferred or manipulated to a carbon, holey carbon, or formvar coating 202 supported by metallic grid bars 203. Van der Waals adhesion forces are orders of magnitude larger than electrostatic forces or the force of gravity acting on small specimens. In another method, a needle can be dipped in glue to adhere the specimen to the probe for transfer to a grid which also contains glue.

FIB milling or laser ablation may be used to create a cross sectioned surface for subsequent site specific analytical characterization. It is well known that material removal rates are dependent on dose, incidence angle, crystal orientation, and material composition. A ubiquitous cross sectioning artifact known colloquially as "curtaining" or the "waterfall effect" consists of local roughness and thickness variation of the surface, and is a direct result of differences in removal rates that may be inherent to the specimen composition or geometry. Curtaining is so named due to the appearance and observation of lines of differential milling that resemble theater curtains which form on the milled surface parallel to the beam direction. The presence and observation of these lines is a direct indication of an uneven and rough milled surface.

Surface roughness and irregular specimen thickness can be problematic for many electron microscopy and other techniques used to analyze the FIB milled surface. As an example, conventionally prepared FIB milled specimens of semiconductor gate structures will yield curtaining artifacts that create thickness changes in the substrate which render 2D dopant analysis via electron holography useless.

Previous patents by the owner of the present invention (e.g. U.S. Pat. Nos. 8,740,209 and 8,789,826, whose contents are incorporated herein for all purposes) describe a specimen carrier and method of ex situ lift out (EXLO) from asymmetric focused ion beam (FIB) prepared specimens for subsequent scanning/transmission electron microscopy (S/TEM) or other site-specific analysis of the extracted specimen (i.e., the EXpressLO method). These previous two patents describe a specimen carrier and methods used in conjunction with standard conical needle-shaped glass micromanipulator probes conventionally used for EXLO, with manipulation to slotted grid carriers (FIG. 3). The advantages to the EXpressLO method are, (i) no carbon or thin film support is needed to support the specimen which allows for advanced microscopy without interference from the carbon film, (ii) the specimen may be post-processed after manipulation to the slotted carrier, and (iii) backside manipulation for additional FIB milling eliminates FIB curtaining artifacts to the regions of interest.

In conventional EXLO, as shown in FIG. 1, a conical hollow or solid glass probe tip is pulled to a fine point (e.g., ~1 micrometer) and the probe outer curved or conical surface is used to pick up or lift out a FIB prepared specimen 103 (FIG. 1) which is then manipulated to a carbon-coated TEM grid carrier, holey carbon-coated TEM grid carrier or similar (e.g. carrier 201 shown in FIG. 2). After the lift out is performed, the probe may be rotated to optimize the position of the specimen for manipulation to the particular carrier.

The EXpressLO lift out method shown in FIG. 3, and described in Applicant's U.S. Pat. Nos. 8,740,209 and 8,789,826, uses a conical glass probe tip 104 as before pulled to a fine point (e.g., ~1 micrometer) to pick up or lift out a FIB prepared asymmetrically undercut specimen 103 using the probe's outer side surface followed by subsequent manipulation to an EXpressLO open half-grid slotted specimen carrier grid 302. The EXpressLO carrier grid 302 supports the specimen via the surface of recessed slots 301 defined by the upper edge 303 and lower edge 304, each separated from one another by a height differential of 5 micrometers or more. Prior to manipulating the probe through the slot such that the specimen 103 rests on the grid surface 301, the probe may be rotating or the specimen may be nudged or rotated using a second probe or the grid edge 303 to optimize the orientation of specimen 103 on top of the probe 104. The specimen's surface may be analyzed, or its internal structure may be analyzed by TEM by passing the electron beam through the specimen spanning the open slot. Using a focused ion beam (FIB) instrument, the directionality of the specimen is denoted by milling an asymmetric undercut. This specimen asymmetry 103 may be easily visualized with the light optical microscope used in the lift out and micromanipulation process to position a specimen in any orientation desired. During the manipulation process, the sample probe may be rotated and/or the specimen may be nudged with either a second probe that is held stationary of via a second micromanipulator or using protruding surfaces of the EXpressLO grid to orient the sample to its desired position prior to manipulating the probe through the EXpressLO grid slot such that the sample may come to rest on the EXpressLO grid surface.

Other methods for manipulating a sample use vacuum suction as a holding force as shown best in FIG. 4. For example, instead of using a solid probe, vacuum can be pulled through a beveled hollow glass tube 401 to lift out a FIB milled free specimen 402 approached from the top of the specimen (Wang U.S. Pat. No. 7,041,985 B1), or to lift out a FIB specimen from its face if the specimen is still attached to the bulk FIB milled trench walls (Arjavac U.S. Pat. No. 8,455,821 B2, Arjavac U.S. Pat. No. 8,890,064 B2). In either of these prior vacuum methods, the specimen 402 is ultimately manipulated to a carbon-coated (202) TEM grid carrier (201) using vacuum or suction forces applied through a hollow glass probe to assist in the lift out and manipulation process as shown in FIG. 4. Probes with a variety of grippers or end effectors may also be used to transfer the specimen to a grid.

Vacuum methods such as described above, however, can be prone to failure over time due to debris clogging the hollow tips and/or requiring additionally complex systems. Accordingly, there is need for alternate methods for manipulating samples during extraction that provide advantages over the prior art.

SUMMARY OF THE INVENTION

The EXpressLO method and apparatus allows for positioning the specimen in any orientation for optimized analysis of cross-sectioned specimens, plan view specimens, or for the so-called backside specimen placement to reduce or eliminate FIB milling or laser ablation curtaining artifacts during subsequent processing using an asymmetric FIB milled cut to identify the specimen. It has been determined that Van der Waals forces can be used for picking the specimen up and out of the FIB trench, as well as securing it to a carbon support film or EXpressLO carrier grid surface. The Van der Waals forces are directly proportional to the surface area in contact between two surfaces. The probe/specimen surface area is larger than the surface area of the freed specimen edges touching the trench sidewalls, and the specimen/carrier surface area is larger than the probe/specimen surface area. Thus, the specimen can be transferred from probe to carrier, by increasing surface area between steps from lift out to manipulation, with the most surface area (and thus strongest adhesion forces) offered between the specimen and carrier.

This current invention exploits the strong surface to surface Van der Waals forces between the probe and the specimen. This is novel because instead of using a conical needle shape with limited surface area available for touching the specimen, it uses one or more flat manipulator probing surfaces positioned relative to the specimen surfaces of interest, thus optimizing the surface area between the specimen and the probe and thereby increasing the Van der Waals adhesion forces between the probe and specimen. Using a flat probe tip also optimizes the geometry of the specimen relative to the probe for accurate and easy lift out and subsequent manipulation and placement of the extracted specimen. Preparing flat surfaces on different regions of the probe tip allows for the optimization of different geometries and attack positions of the probe with respect to the specimen as well as with respect to the EXpressLO carrier grid or carbon (or thin-film)-coated support carrier grid. Most importantly, the shaped flat probe optimizes the surface area and therefore the Van der Waals forces between the probe and the specimen allowing for precise manipulation to the larger surface area of either the EXpressLO or carbon-coated or similar grid carrier without the specimen falling off the probe.

To facilitate FIB prepared (or other) specimen extraction or "lift out" such that the specimen orientation is known and maintained for easy manipulation to EXpressLO grid carriers, flat probes or end effectors are used according to teachings of the present invention. Flat probes optimize the surface area needed for the larger Van der Waals adhesion forces that secure and optimize the orientation of the specimen. The probes are typically solid glass that are first pulled to a sharp needle-like point on the order of 1 micrometer using a commercial glass puller. Alternatively, the probes may be metal tips produced by electrochemical or other methods. The probe is then beveled flat using FIB or broad ion beam milling, laser ablation, mechanical polishing, or the desired probe tip shape may be 3D printed onto the end of a "blank" probe.

Aspects of the invention involve a method for lift out of a specimen milled upright within a trench of bulk material where the specimen is of a type having specimen edges that may be free from but under attractive force from adjacent trench edges of the trench. The method comprises providing a solid probe having a first planar beveled surface formed at or adjacent a probe tip thereof. The first planar beveled surface has a non-zero bevel angle relative to a normal to a long axis of the probe and a greater surface area than a surface area of the specimen edges. The long axis of the probe is positioned at a tilt angle between the long axis and a normal to a face of the specimen, wherein the tilt angle and bevel angle are approximately equal. The first planar beveled surface is then abutted against a face of the specimen within the trench such that Van der Waals forces between the first planar beveled surface and the face of the specimen is substantially greater than the attractive force between the specimen edges and the adjacent trench edges. Finally, the specimen is lifted out from the trench with the probe.

Aspects of the invention also include a probe structure used to lift out a specimen prepared from bulk material of a sample. The probe includes a solid elongated body disposed along a long axis of the probe and terminating in a probe tip and a solid planar beveled surface at or adjacent an end of the probe tip. This solid planar beveled surface is formed at a non-zero beveled angle relative to a normal of the long axis of the probe. The solid planar beveled surface is configured to impart Van der Waals attractive force to a sample surface positioned immediately adjacent the solid beveled surface of the probe so that the sample can be detached from and lifted from the bulk material and transported to a grid for investigation. Various embodiments of the beveled surface are described, including an elliptical probe tip surface beveled between 10 and 45 degrees to the normal to the probe long axis. Another embodiment includes one or more planar surfaces formed into the sides of the probe body that are parallel to the probe long axis. In each of these embodiments, the planar face of the specimen is attracted via Van der Waals forces to the planar beveled surface at or adjacent the probe tip.

Therefore, in this new and novel invention, we provide methods for optimizing Van der Waals forces for both specimen extraction (e.g., "lift out"), and manipulation via site specific placement to conventional thin-film coated grid carriers or previously patented slotted specimen EXpressLO carriers.

BRIEF DESCRIPTION OF THE DRAWINGS

The foregoing and other objects, features and advantages of the invention will become more readily apparent from the following detailed description of a preferred embodiment of the invention that proceeds with reference to the accompanying drawings, in which.

DETAILED DESCRIPTION

It is understood that these manipulation methods described, while generally performed in ambient conditions independent of the FIB, may also be performed inside of a FIB instrument.

Figure 1:
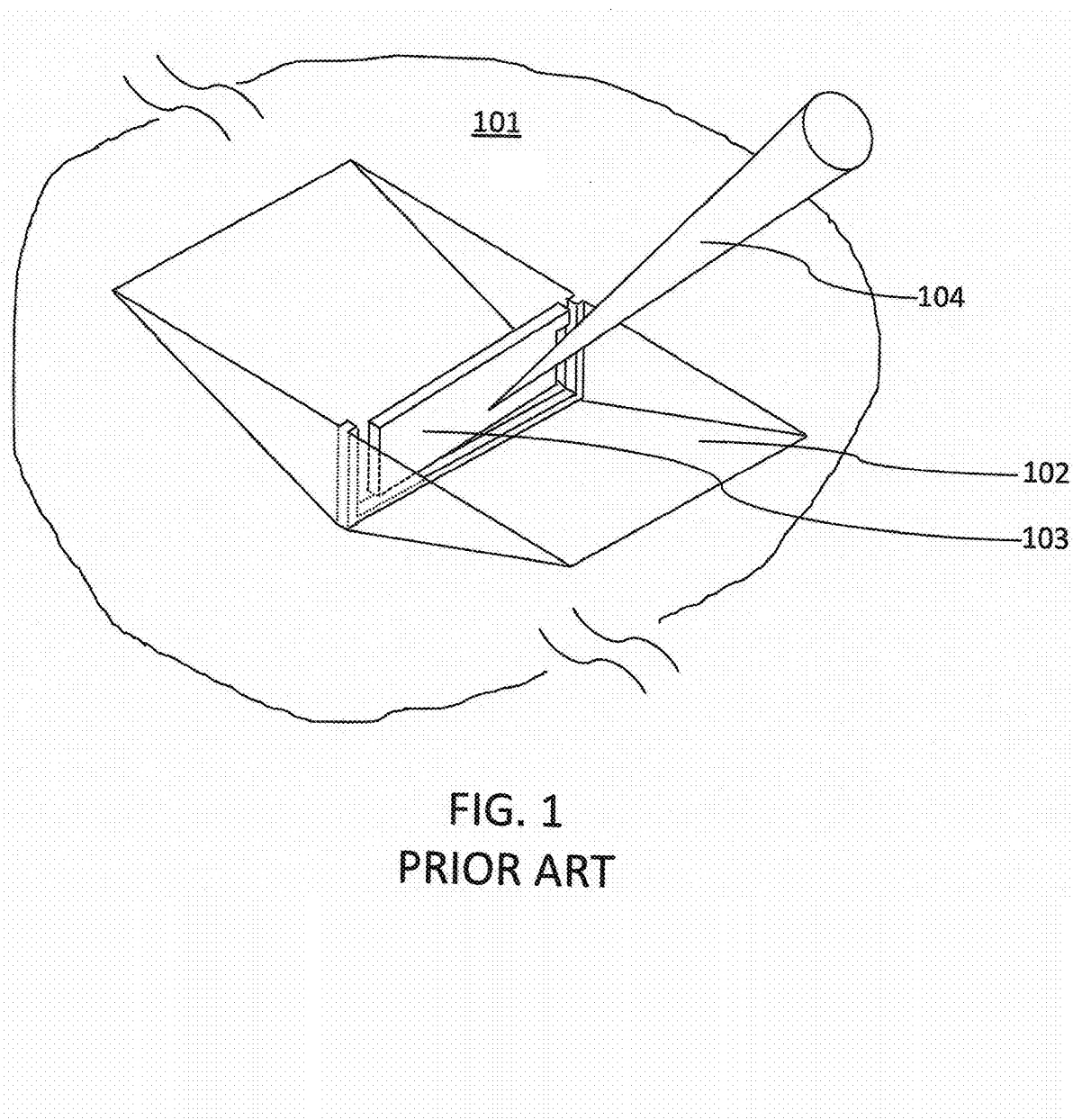
FIG. 1 is a schematic diagram of prior art showing EXLO using the curved surfaces of a solid conical glass probe tip.
Figure 2:
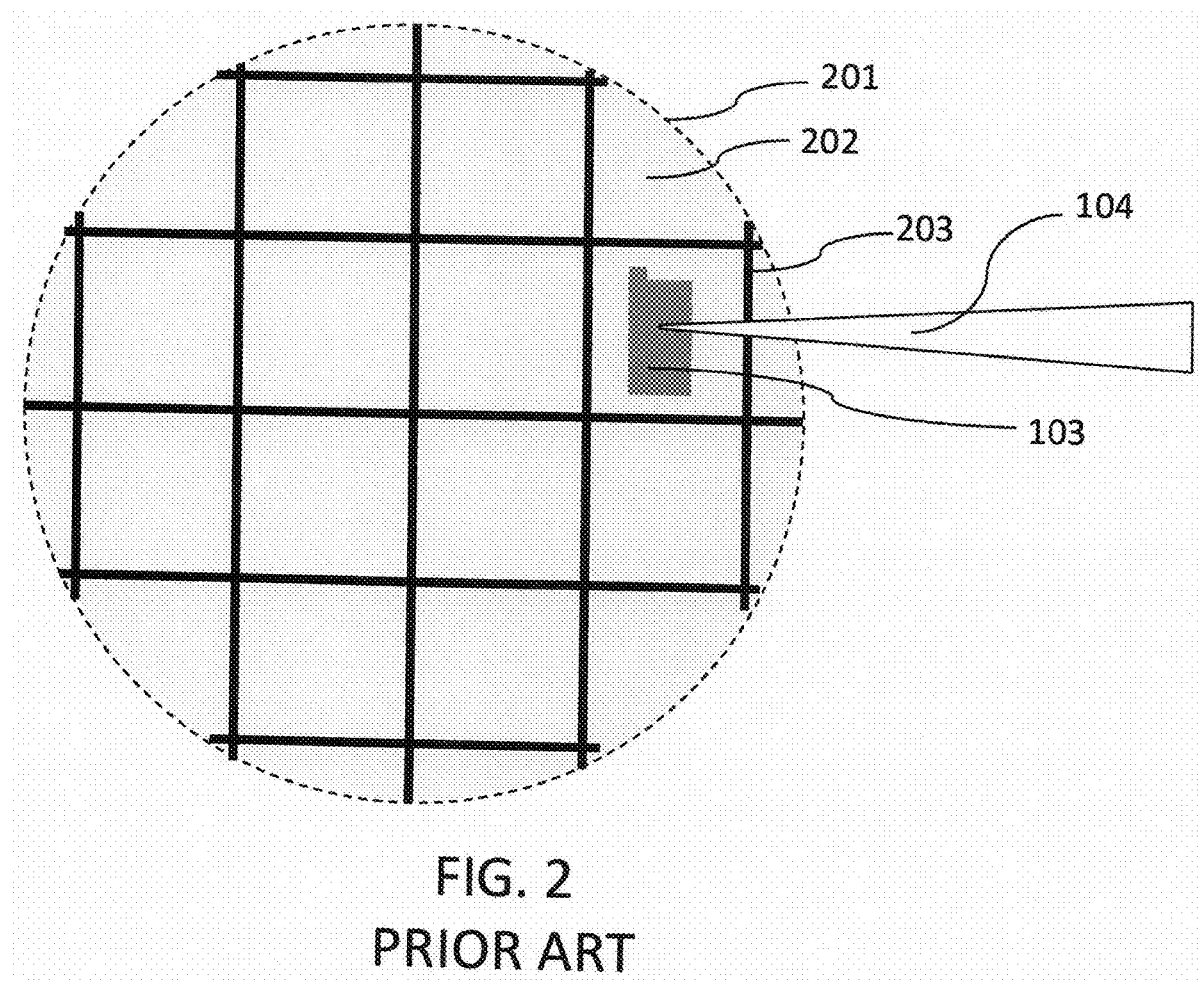
FIG. 2 is a schematic diagram of prior art showing EXLO manipulation to a small region of a carbon-coated grid using the prior art probe of FIG. 1.
Figure 3:
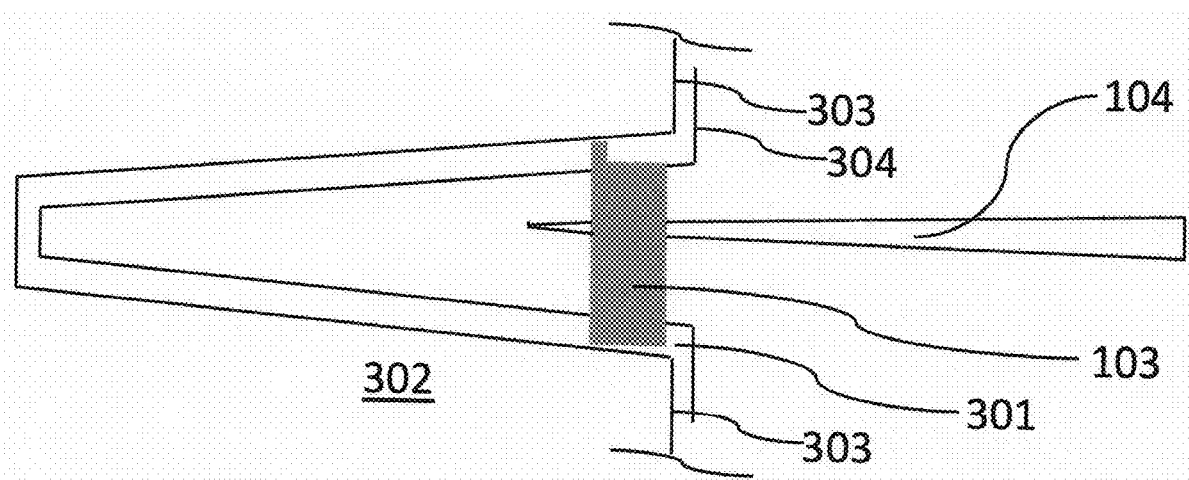
FIG. 3 is a schematic diagram of prior art showing manipulation of an asymmetric FIB prepared specimen into a backside orientation onto an EXpressLO slotted grid surface using the prior art probe of FIG. 1.
Figure 4:
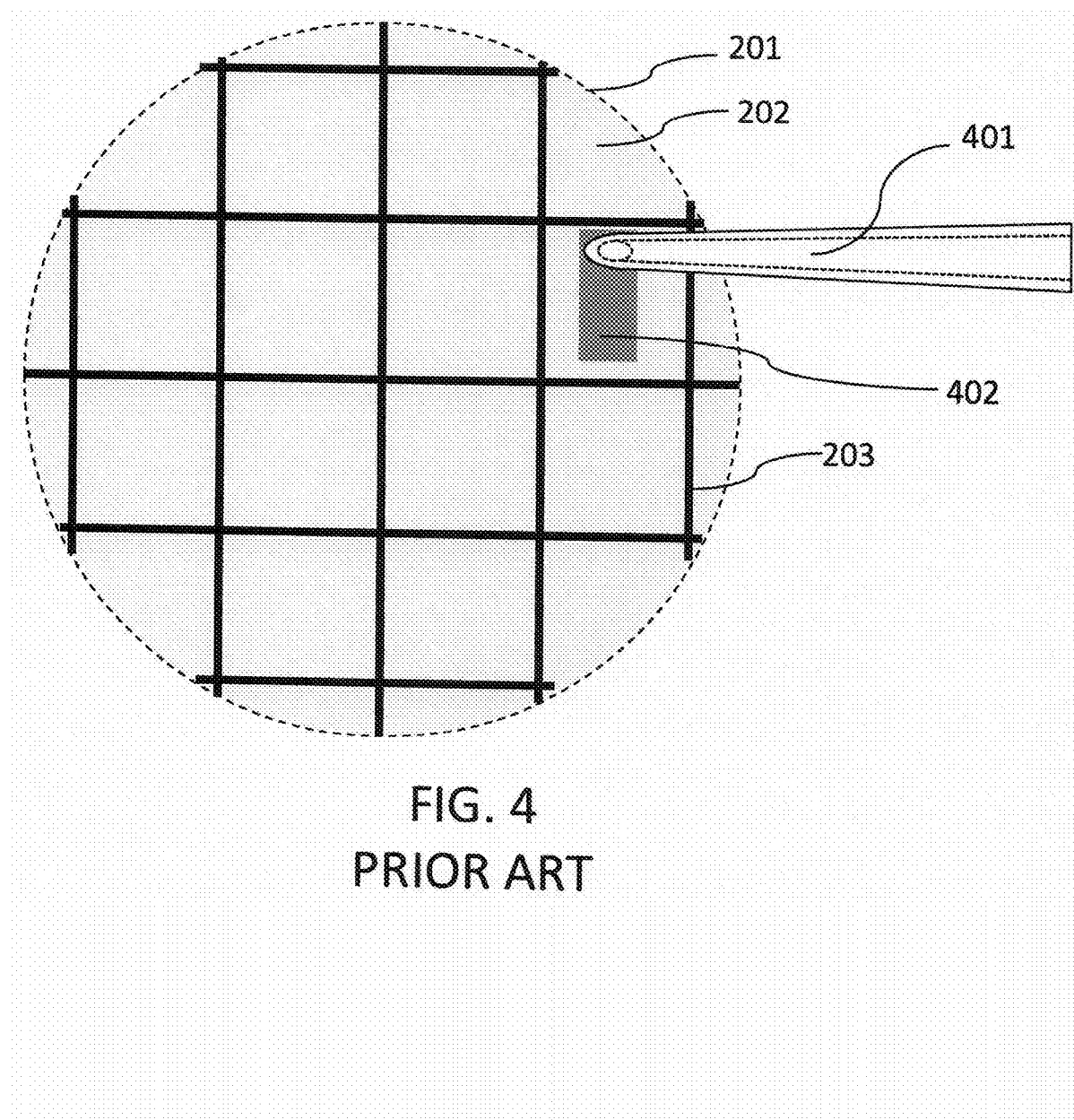
FIG. 4 is a schematic diagram of prior art showing manipulation of an FIB prepared specimen to a small portion of a carbon-coated TEM grid carrier using vacuum/suction forces through a hollow glass probe tip.
Figure 5A:
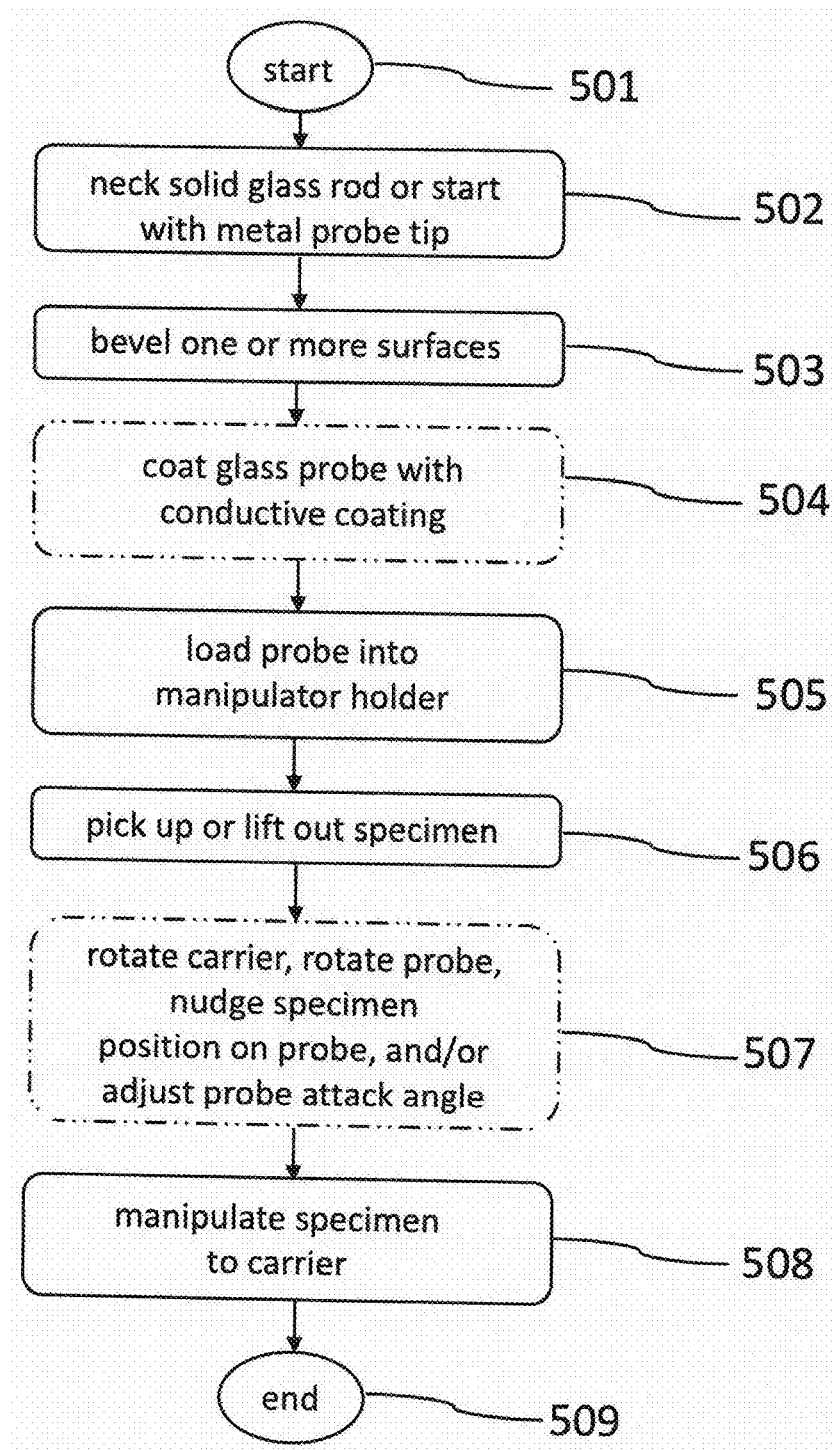
FIG. 5a is a flow diagram of lift out and manipulation steps using a beveled solid probe tip according to aspects of the invention.

FIG. 5a is a flow diagram of the start of the lift out process 501 and micromanipulations steps using a beveled and flat probe tip surface. The probe tip is necked and pulled to a fine point in block 502 using standard commercially available glass pulling methods, or a commercially available metal probe tip is used. Then one or more surfaces are beveled in block 503, as detailed in FIG. 6a-c below. The glass probe tip may be optionally metalized, or made conductive in block 504 by sputter coating a conductive layer or by dipping, coating or painting the probe tip with permanent ink (e.g., conductive particles in a solvent, see Giannuzzi and Clark, 2017, herein incorporated for all purposes) (see FIG. 5b). The beveled probe is loaded into a multi-axis manipulator holder in block 505 (and see FIG. 5c) and specimen lift out in block 506 is then performed (see FIGS. 7a-c). After lift out, the position of the specimen with respect to the manipulator is evaluated. At this juncture and in block 507, the carrier may be rotated, the tip may be rotated or adjusted in yaw, the specimen may be nudged using a second stationary probe tip, a probe tip on a second manipulator, or using the carrier itself, and/or the probe angle of attack (e.g. tilt angle T) may be altered prior to manipulation to the carrier of choice, which may include an EXpressLO carrier grid. Details on how to optimize the specimen is given below. The specimen is manipulated to the grid carrier of choice in block 508, and the process may begin again, block 501, or ended, block 509, so that the specimen may be analyzed.

Figure 5B:
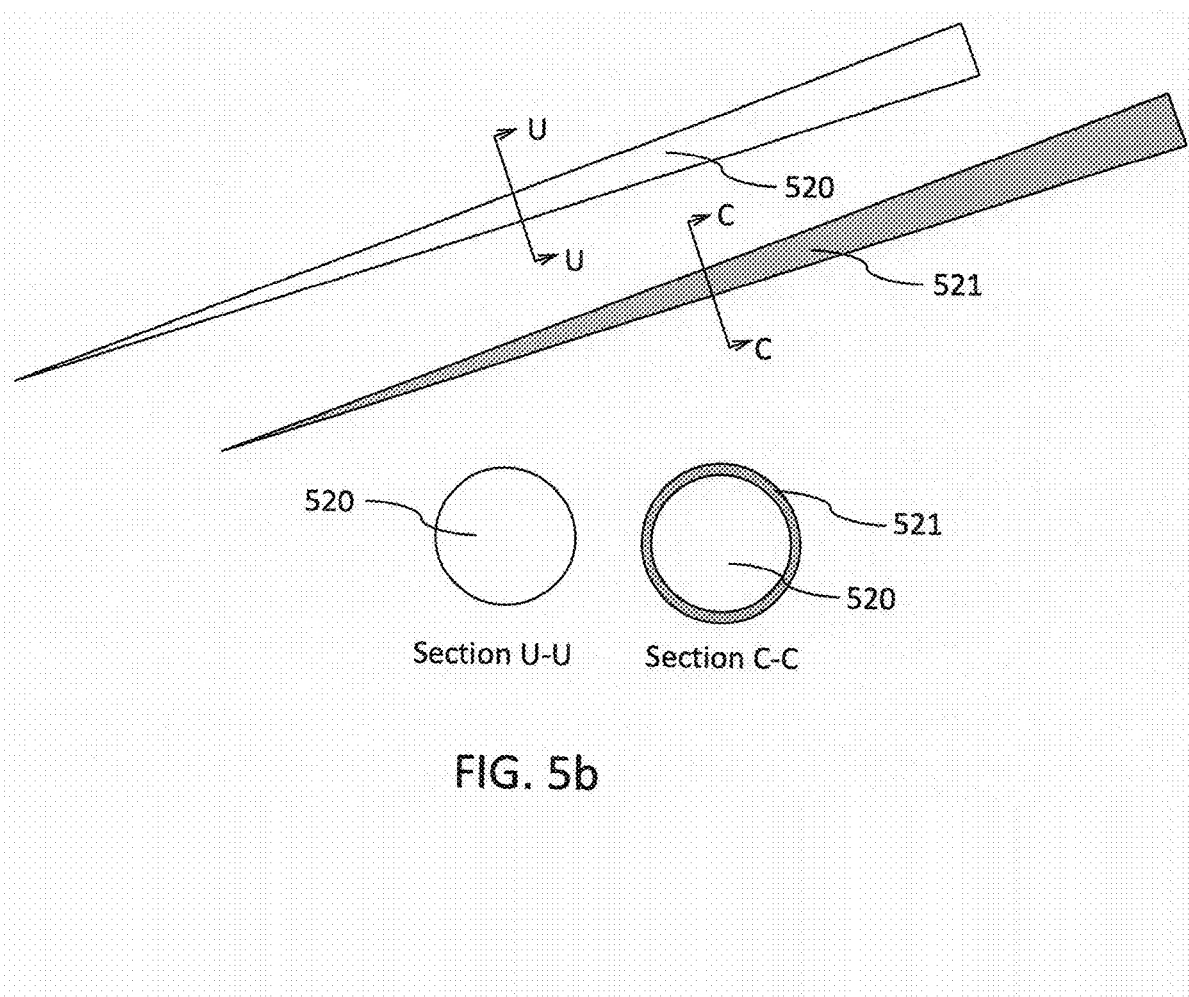
FIG. 5b is a schematic diagram, including side elevation views and cross-sections, of an uncoated and coated probe tip according to aspects of the invention.

FIG. 5b is a schematic diagram of the entirety of two alternate solid probes, a first probe 520 after beveling but without a metallized coating, and a second probe with a metalized coating 521 applied over base material 520. It should be understood that, due to tiny size of the beveled surface tip relative to the entire length of the probe, it would be impossible to view the beveled surface tip while viewing the entire probe length (~4-5 mm) with the naked eye as shown in FIG. 5a. The section U-U shows a section of the uncoated glass probe 520, while the section C-C shows coating 521 applied which would also conform to any beveled surface. It is understood that any beveled surface would also contain the metalized coating layer 521.

Figure 5C:
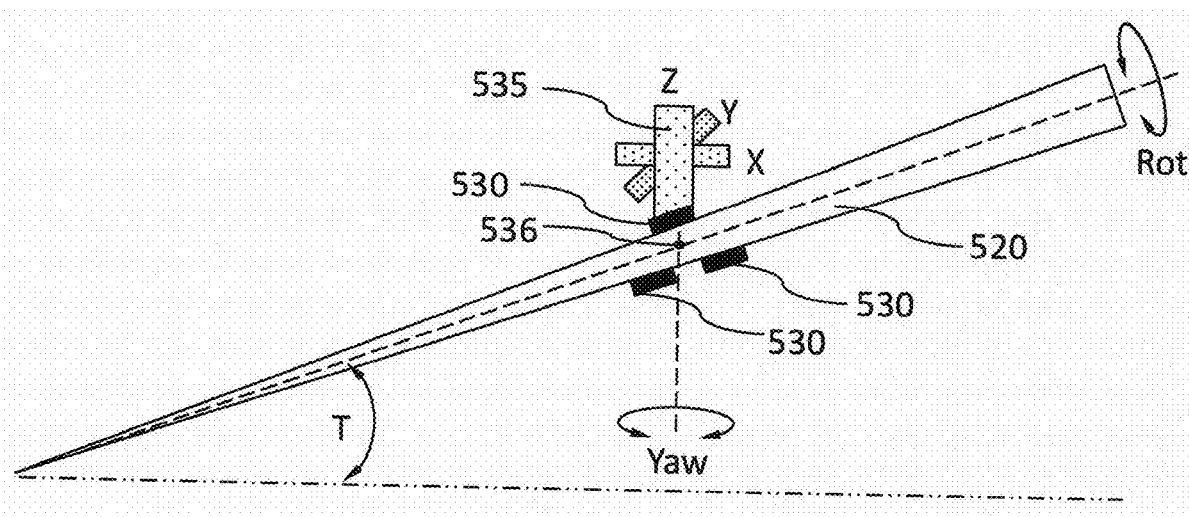
FIG. 5c is a schematic side elevation view of the uncoated probe of FIG. 5b installed within a multi-axis motorized probe tip holder.

FIG. 5c is a schematic diagram of a beveled solid probe 520 (which may be uncoated or coated with metal) mounted in a multi-axis and motorized, programmable, and computerized micromanipulator probe holder 530. Probe holder 530 is attached to motorized controller 535 for movement of probe 520 in 3 orthogonal directions (X,Y,Z), with motorized tilt axis 536 providing tilt angle T from 0 to 90 degrees, motorized 360 degree rotation (Rot) in either the clockwise or counterclockwise direction, and motorized 180 degree rotation in yaw (Yaw). As before, it should be understood that it would be impossible to view the beveled surface tip while viewing the entire probe length (~4-5 mm) with the naked eye as shown in FIG. 5c. The multi-axis motorized micromanipulator probe holder links to adjustable brackets to set coarse positioning of the motorized probe holder relative to the specimen.

Figure 6A:
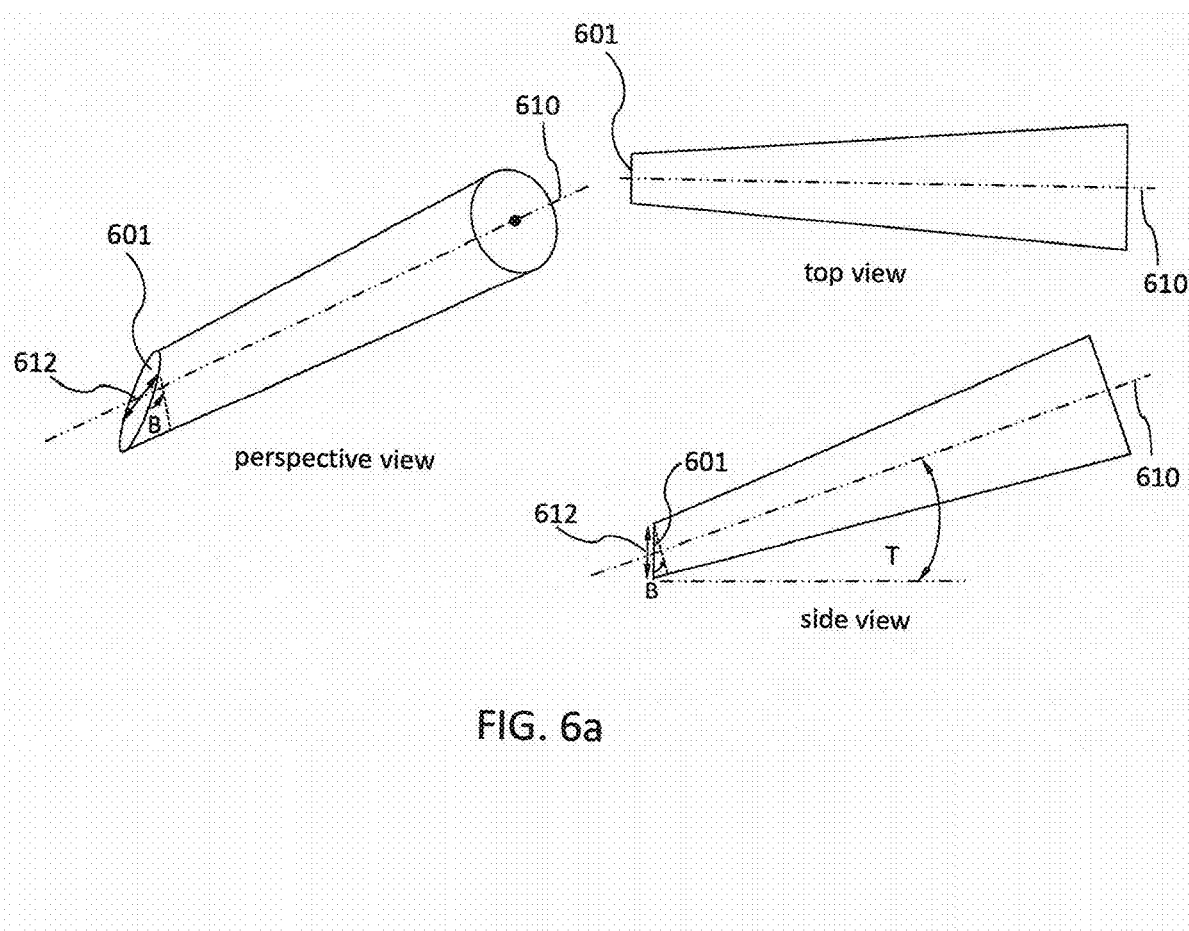
FIGS. 6a to 6c are schematic diagrams of various beveled solid probe tips constructed according to aspects of the invention, including those shaped with (a) an elliptical bevel surface and (b) one polygonal surface bevel or (c) two polygonal surface bevels.
Figure 6B:
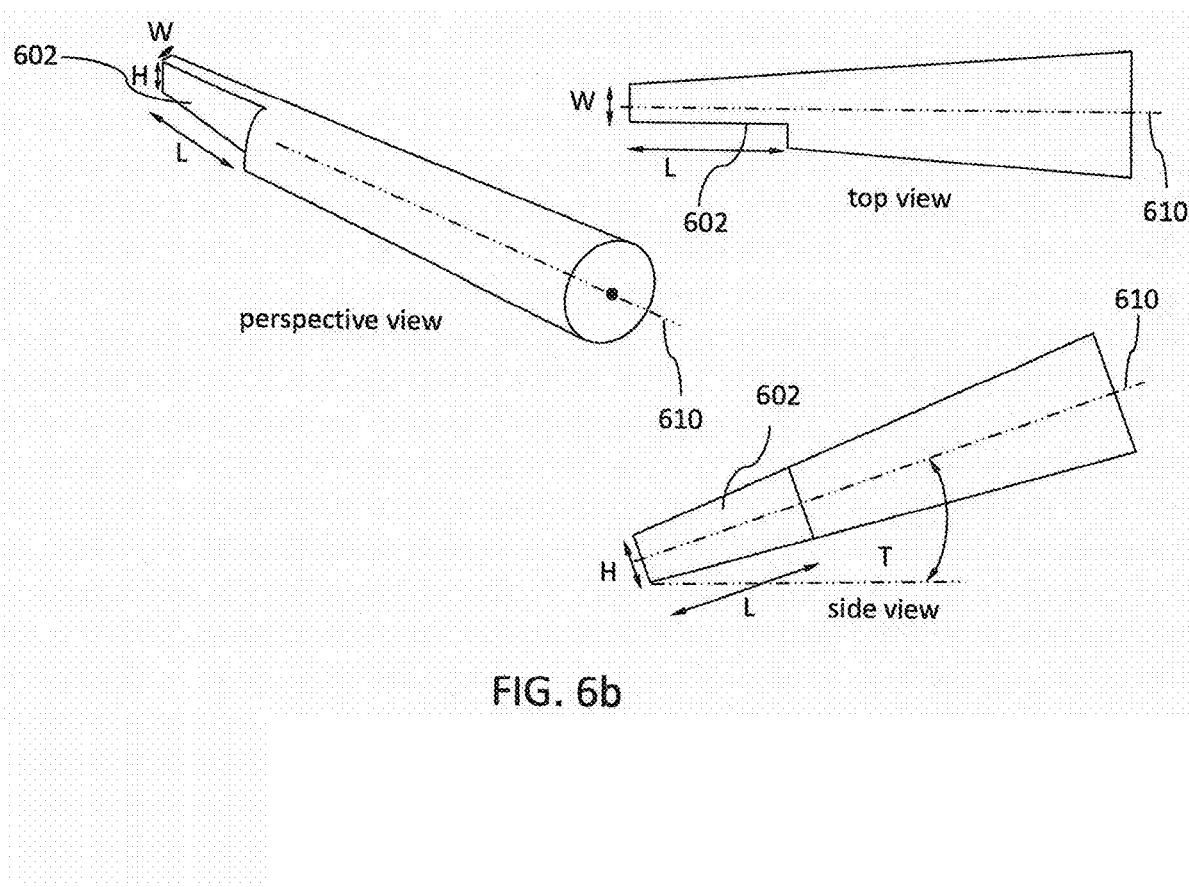
Figure 6C:
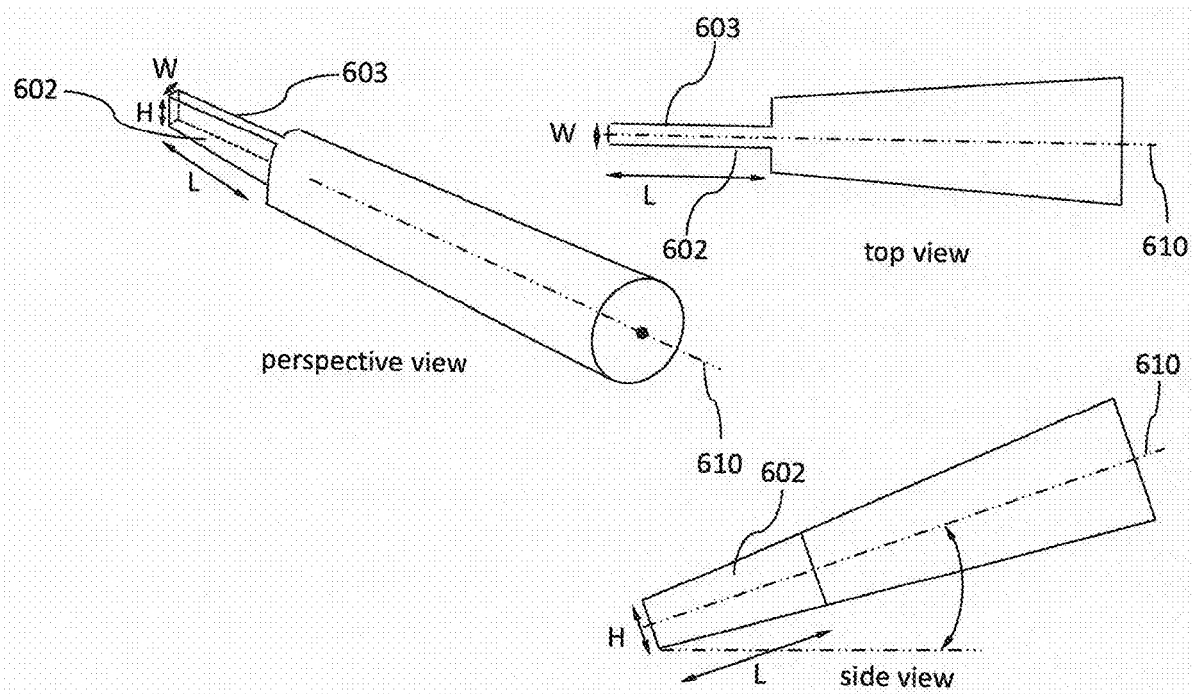

FIGS. 6a-6c illustrate various beveled flat solid probes constructed according to various aspects of the invention, including one aspect having an elliptical probe terminal surface 601 (FIG. 6a) defined along a front tip of the probe, and other aspects having polygonal probe terminal surfaces 602, 603 (FIG. 6b, FIG. 6c) formed on side edges of the otherwise conical probe. To optimize Van der Waals surface forces between the flat beveled solid probe tip (601, 602, 603) and the longest flat surface of the specimen 103 (see, e.g., FIG. 7a), the position of the probe long axis 610 relative to the specimen surface plane normal will vary depending on the beveled probe surface location as described below.

FIG. 6a is a schematic diagram of a beveled flat solid probe 520 having an elliptical terminal surface or tip 601. To optimize Van der Waals surface forces between the flat beveled solid probe tip 601 and the longest flat surface of the specimen 103 (see, e.g., FIG. 7a), the position of the probe long axis 610 relative to the specimen surface plane normal will be optimized as described below. In FIG. 6a, the probe tilt angle, T, and angle from the horizontal to the long probe axis 610 should generally be between approximately 10-45 degrees such that the beveled face 601 is approximately parallel to the specimen face 103 (see FIG. 7a). The long diameter 612 of the beveled face 601 should be approximately 25-75% of the total specimen face 103 depth and will generally be ~2-10 micrometers for a $Ga_+$ ion FIB specimen 103 or larger for a $Xe_+$ ion source plasma FIB or laser ablation prepared specimen. As shown in FIG. 6a, the bevel angle B with respect to a normal to probe long axis 610 is approximately equal to the tilt angle T since the angular difference between the outer probe edge and the probe axis 610 is negligible at these small dimensions. Using this geometry, the beveled face 601 will appear as a straight edge as viewed by the light optical microscope camera imaging denoted by the top view section.

In FIG. 6b, the probe is shaped along a side surface thereof to create a flat beveled polygonal surface 602 formed in a plane that is approximately parallel to the probe axis 610. The height H at the probe tip should be about 1-5 micrometers or more depending on the specimen size, the length L will be as long or longer than the specimen length (about 5-30 micrometers or longer) and the width W should be approximately 0.5 micrometer or larger.

In FIG. 6c, a further alternate embodiment of the probe includes two beveled polygonal surfaces 602, 603 formed on opposing sides of the probe adjacent the probe tip. Surfaces 602, 603 are created approximately parallel to each other, and parallel to the probe axis 610. As per FIG. 6b, in FIG. 6c the height H at the probe tip should be about 1-5 micrometers or more depending on the specimen size, the length L will be as long or longer than the specimen length (about 5-30 micrometers or longer) and the width W should be approximately 0.5 micrometer or larger.

Figure 7A:
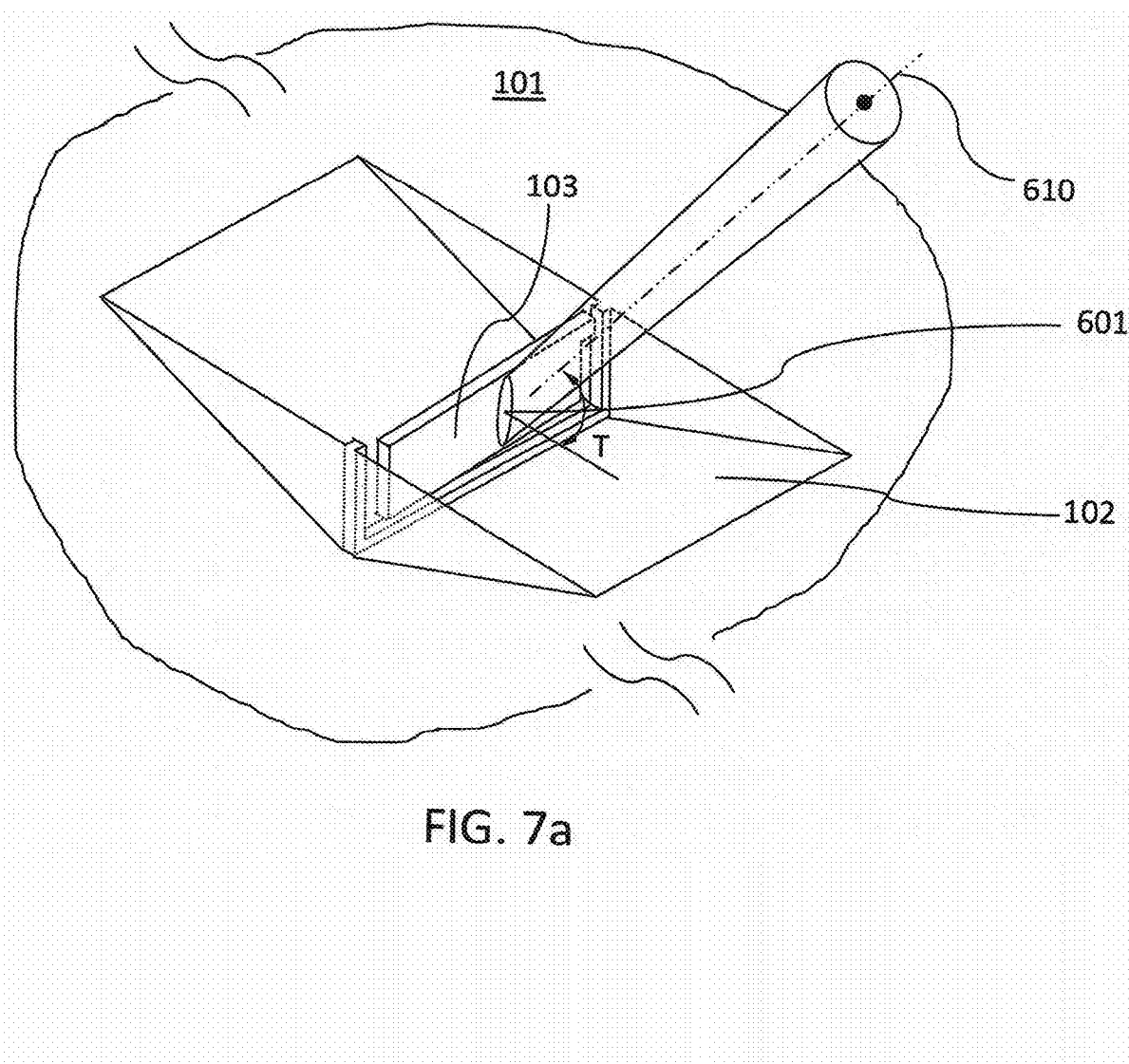
FIGS. 7a to 7c are schematic diagrams of a specimen and lift out geometry using the beveled solid probe tips of FIGS. 6a to 6c, respectively.
Figure 7B:
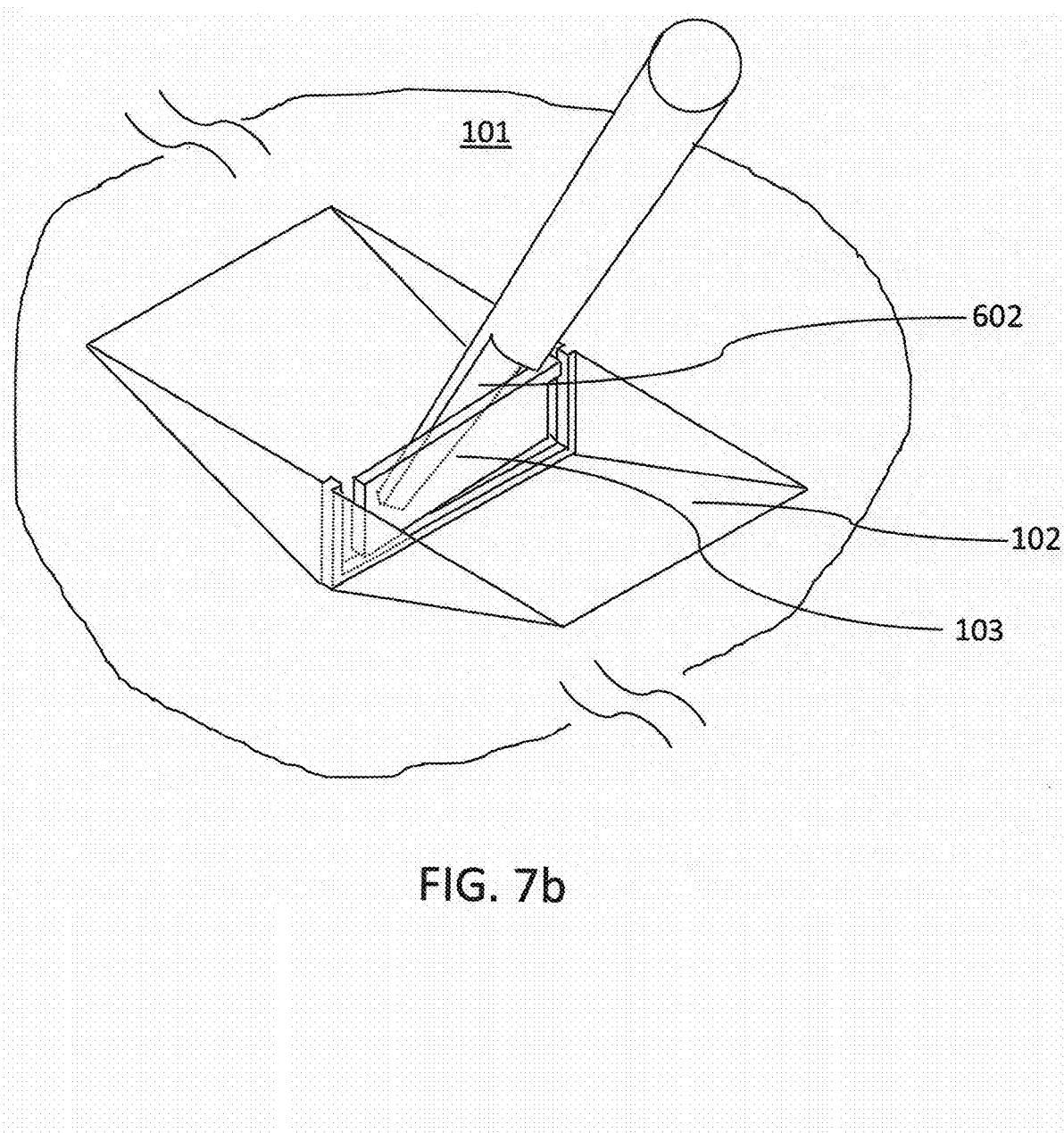
Figure 7C:
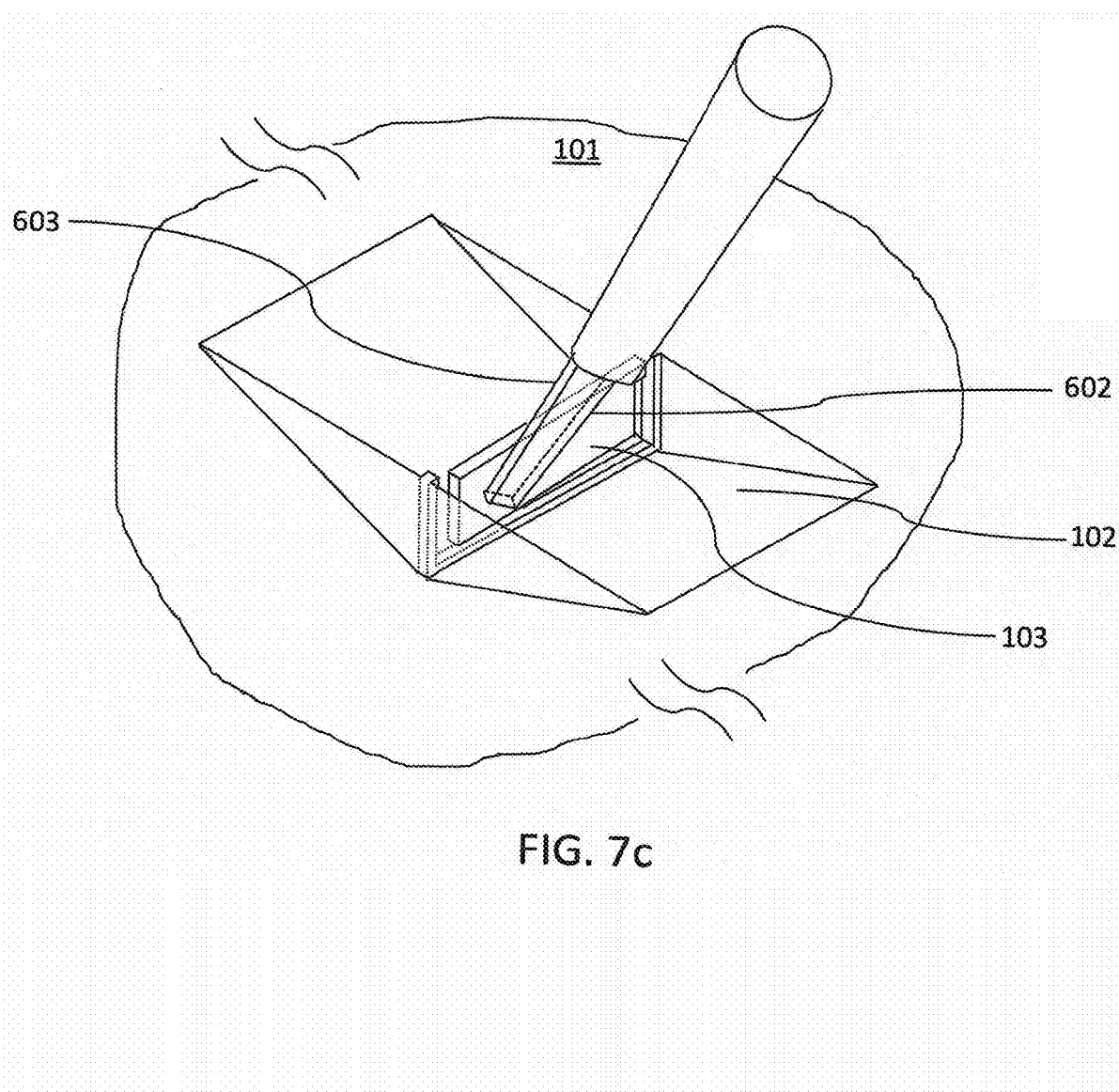

When the specimen 103 in FIG. 7a-c is FIB milled free, it will generally remain nearly vertical falling slightly into the trench with perhaps a slight twist relative to its original location as shown. The specimen stays put due to small Van der Waals forces of the specimen edge(s) touching the bottom and/or side(s) of the trench walls 102. The specimen may be rotated manually or via automated stage rotation and/or the exact probe position relative to the specimen, see FIG. 11. Note that the as per FIG. 5c, the probe tilt (T), rotation (Rot), or yaw (Yaw)) can be adjusted to accommodate slight deviations in the specimen orientation once FIB milled free. Since the surface area between the flat solid beveled probe surface(s) 601 (also 602 or 603) and the specimen surface 103 will be at least 10% larger, but generally much larger, than the specimen edges touching the trench wall or sides, the specimen is easily lifted out or removed from the FIB milled trenches. In addition, as the probe from FIG. 6a approaches the flat specimen surface as per FIG. 7a, the specimen will be pulled to and adhere to the flat beveled solid probe surface 601 as a result of the strong Van der Waals adhesion forces. The probe is raised up in the Z direction to a safe distance from the sample so that the carrier can be moved under the probe holding the specimen with the stage.

The polygonal beveled flat solid probe surface or surfaces 602, 603 illustrated in FIG. 6b and FIG. 6c and shown in the lift out position defined in FIG. 7b, FIG. 7c. should be parallel or nearly parallel to the probe long axis 610 and also approximately parallel to the long face of the specimen 103. Alternatively, the beveled flat solid probe surface 602, 603 shall follow the original taper angle of the conical probe. This beveled surface(s) will create a rectangular or slightly trapezoidal shape that provides a larger surface area than the elliptical bevel described above in FIG. 6a. The degree of the trapezoidal shape will depend on the starting conical probe taper angle. The beveled tip surface should be consistent with the starting probe tip dimensions of 1-2 micrometers and should extend to a length consistent with or longer then the specimen length (i.e., about 5-30 micrometers or more). With this geometry, the remaining probe material in the center of two beveled surfaces will only be about 0.1-2 micrometers thick. If only one beveled surface 602 is created (FIG. 6b), then the specimen and or the probe should be rotated to position the flat beveled surface 602 parallel or nearly parallel to the specimen side 103 desired for lift out as per FIG. 7b. With two beveled tip surfaces 602, 603 (FIG. 6c), either specimen side 103 may be approached by either probe face and lifted out for subsequent manipulation, thus allowing for better optimization (FIG. 7c). When the specimen is FIB milled free, it will generally release from all trench walls falling slightly into the trench with possibly a slight (if any) twist relative to its original location. The specimen stays in this position due to small Van der Waals forces of the specimen edge(s) touching the bottom and/or side of the trench walls. As before, the exact probe position (i.e., tilt, twist, yaw,) can be adjusted and manipulated to accommodate slight deviations in the specimen orientation once FIB milled free or the sample surface 101 containing the specimen 103 itself may be rotated manually or with the stage with respect to the probe to accommodate angular deviations. Since the surface area between the flat solid beveled probe surfaces (602 or 603) and the specimen surface 103 is much larger than the specimen surface touching the trench wall, the specimen is easily lifted out. As the flat beveled solid probe surface (602 or 603) approaches the flat specimen 103 surface, the specimen will be pulled to the flat beveled solid probe surface with the strong Van der Waals adhesion forces.

The process for manipulating the specimen after lift out will now be described. After lift out using the geometry shown in FIG. 7a, FIG. 7b, or FIG. 7c, the specimen can be manipulated to either a carbon-coated TEM grid or an EXpressLO grid or some other carrier. Prior to manipulation, it may be necessary to nudge or rotate the specimen position relative to the probe to optimize the manipulation process.

Figure 8A:
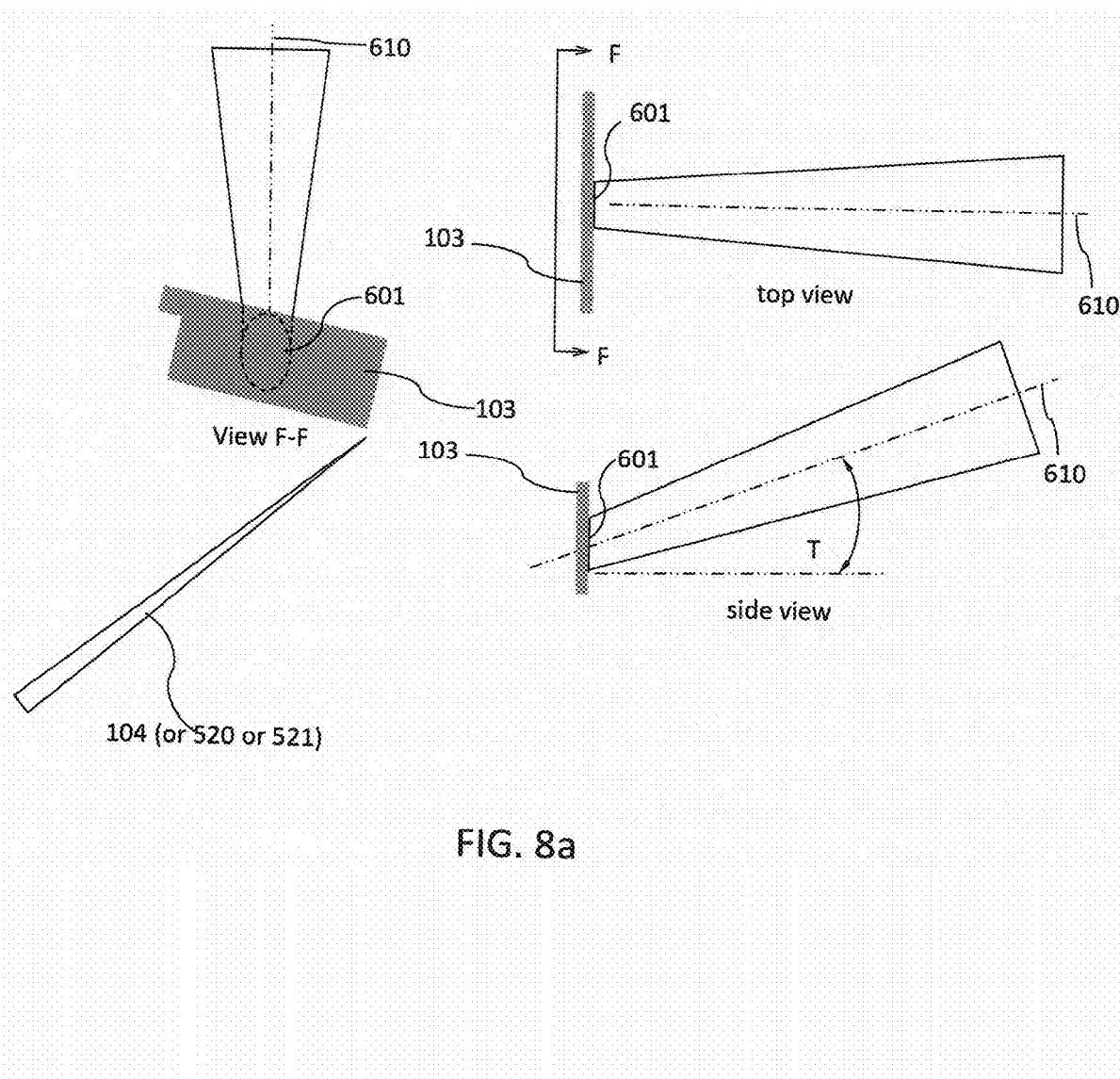
FIGS. 8a to 8h are schematic diagrams showing specimen manipulation to a carbon-coated TEM grid using a beveled solid probe tip having (a-f) an elliptical probe flat surface, and (g,h) a polygonal rectangular or trapezoidal probe flat surface or surfaces.

FIG. 8a shows the specimen 103 attached to the elliptical beveled surface 601 after lift out, with the probe safely above the sample surface 101. If the specimen 103 is slightly rotated with respect to the probe axis 610 as shown in view F-F, a second stationary probe 104 (or 520/521) or probe mounted on a second manipulator may be used to nudge or optimize its position.

Figure 8B:
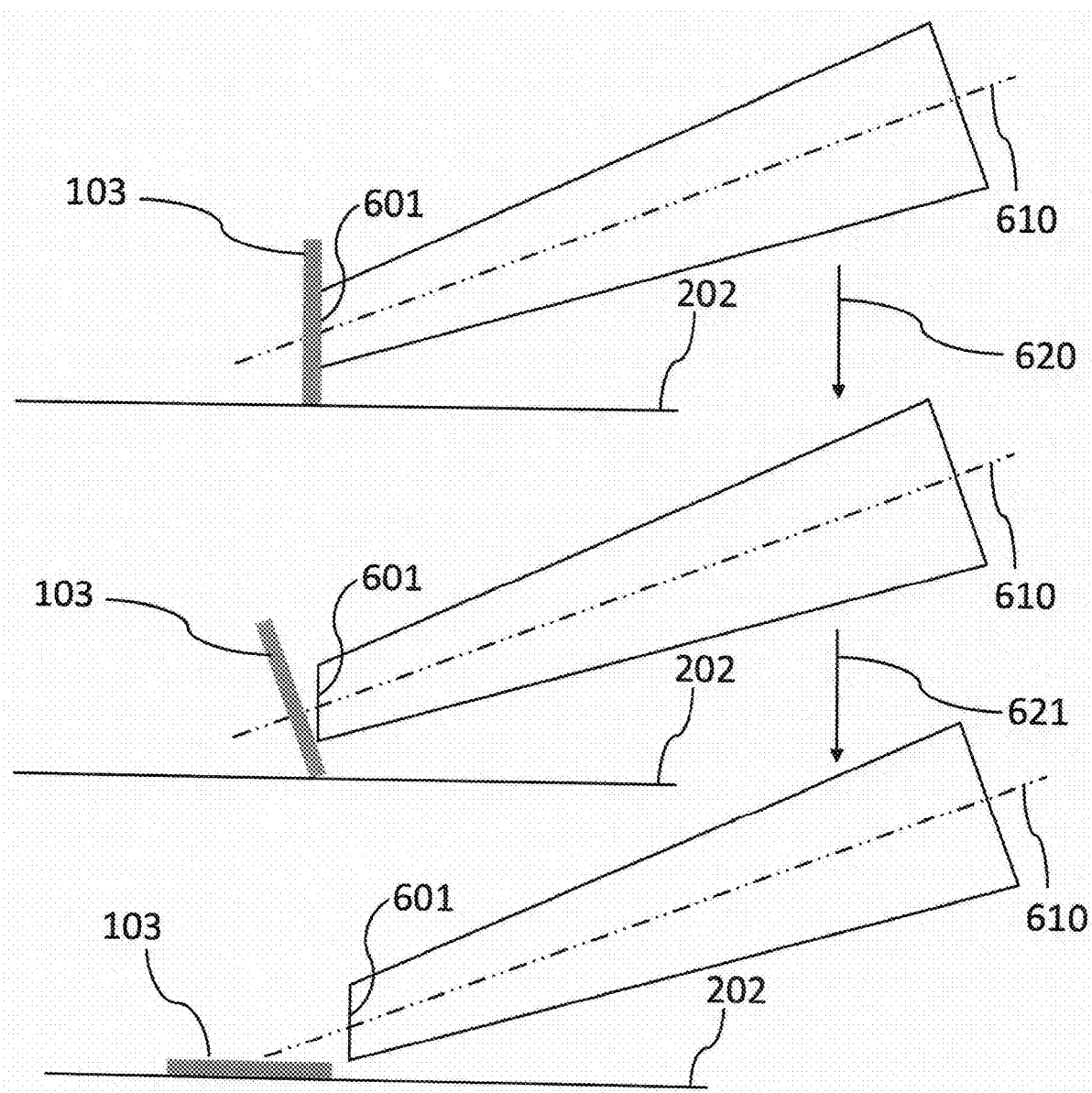

Then, as shown in FIG. 8b, the probe containing the specimen can be lowered to the surface 202 of a carbon-coated grid. By touching the specimen 103 to the carbon-coated grid surface 202, and moving the probe downward toward mounting surface 202 as in the sequence shown by the arrows 620, 621, the sample 103 can release from the beveled surface 601 and come to rest flat on the carbon-coated grid 202.

Figure 8C:
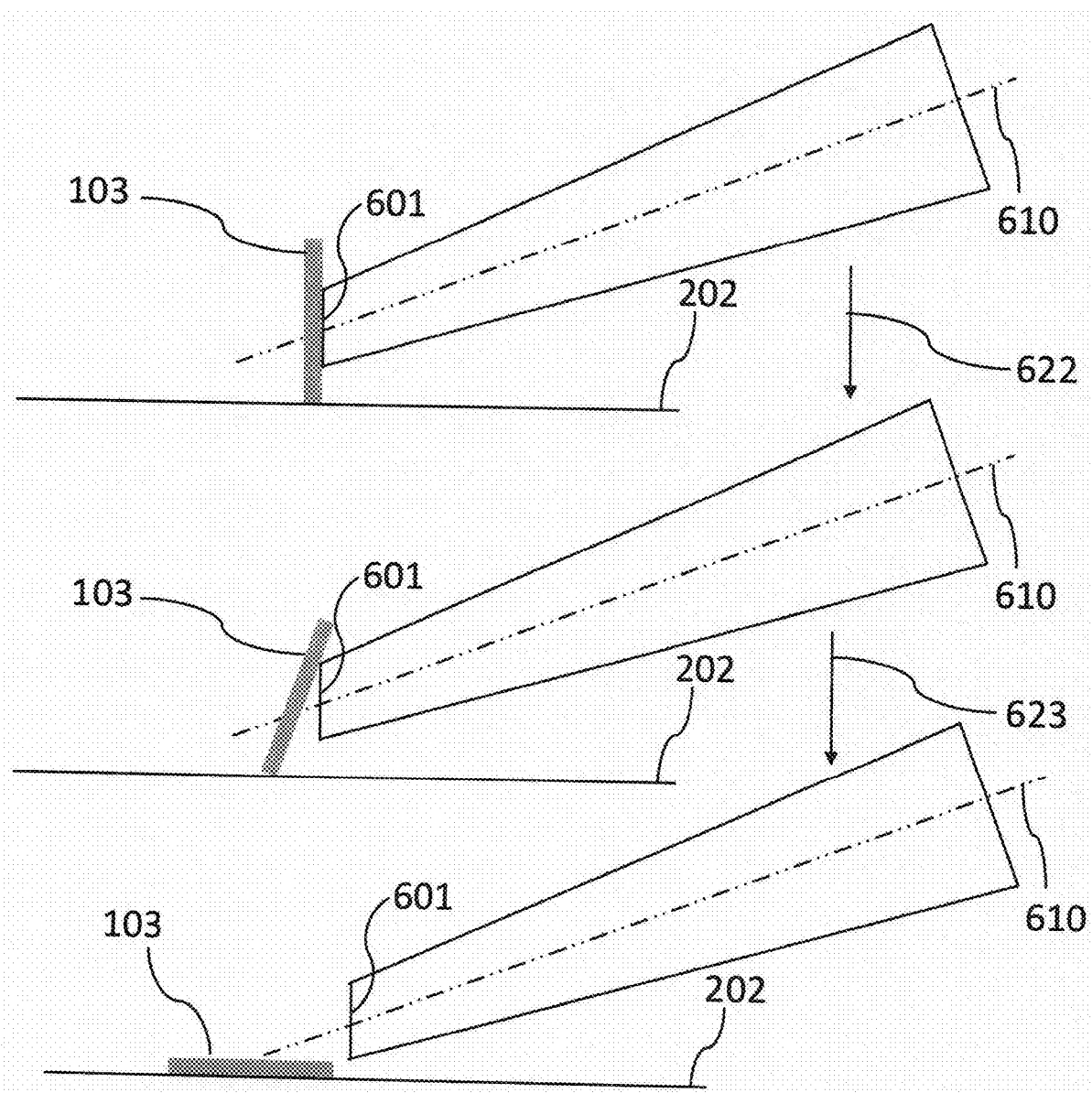
Figure 8D:
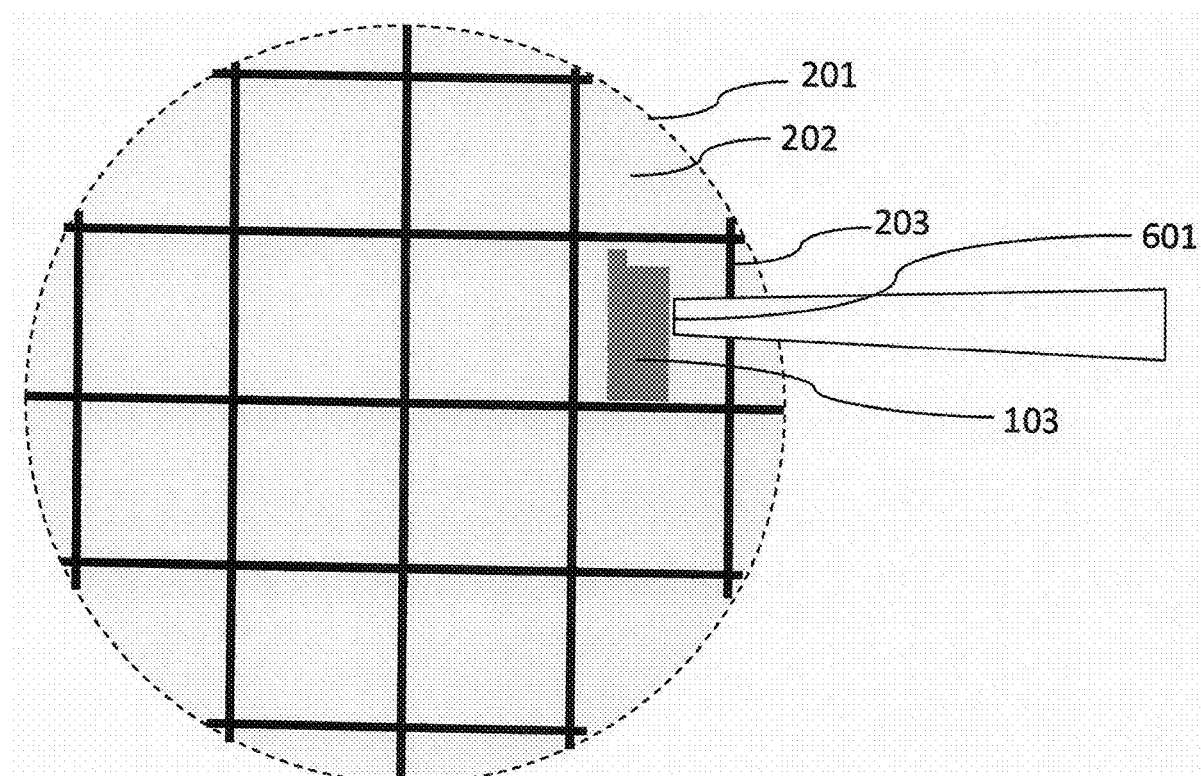
Figure 8E:
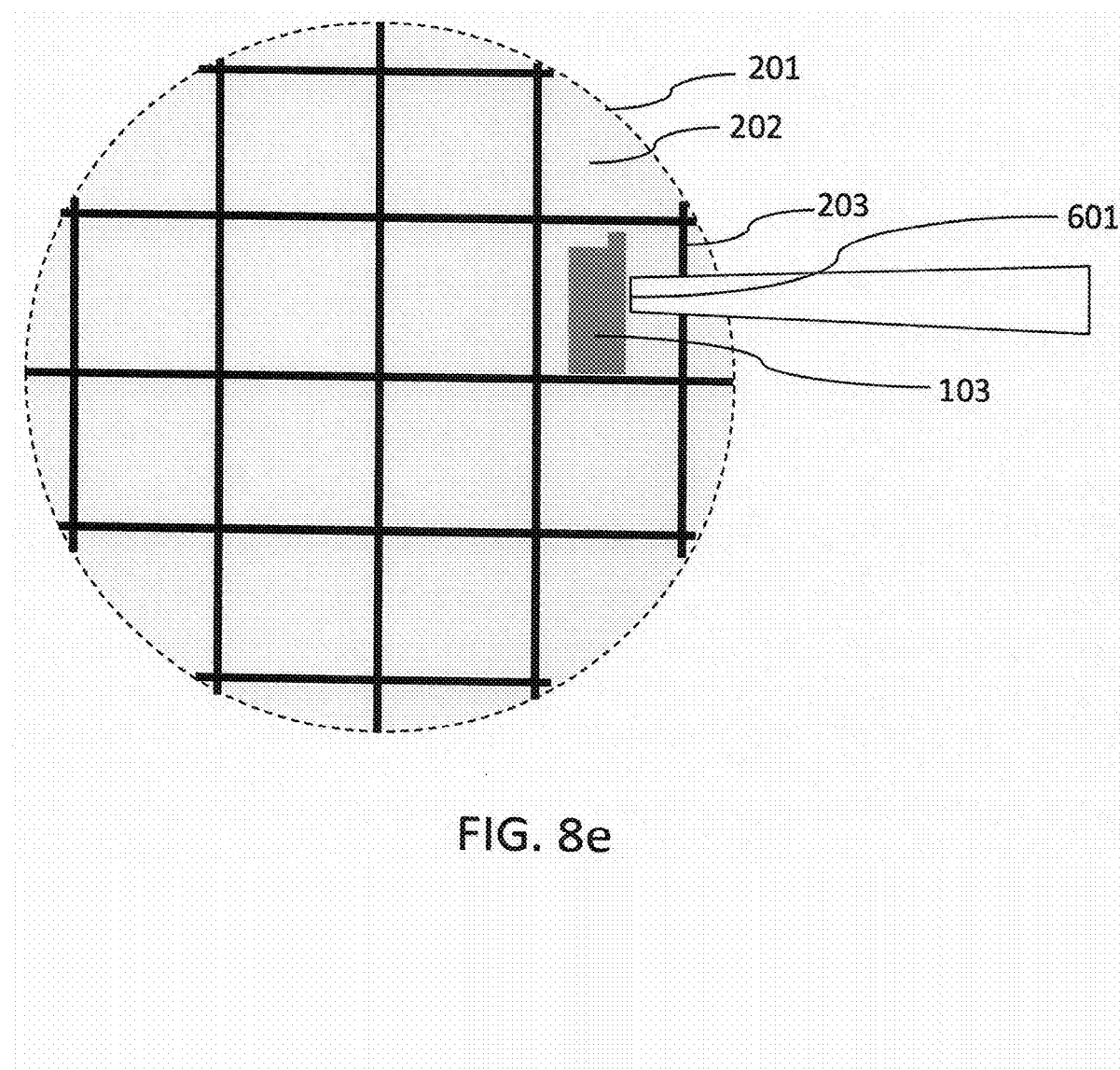
Figure 8F:
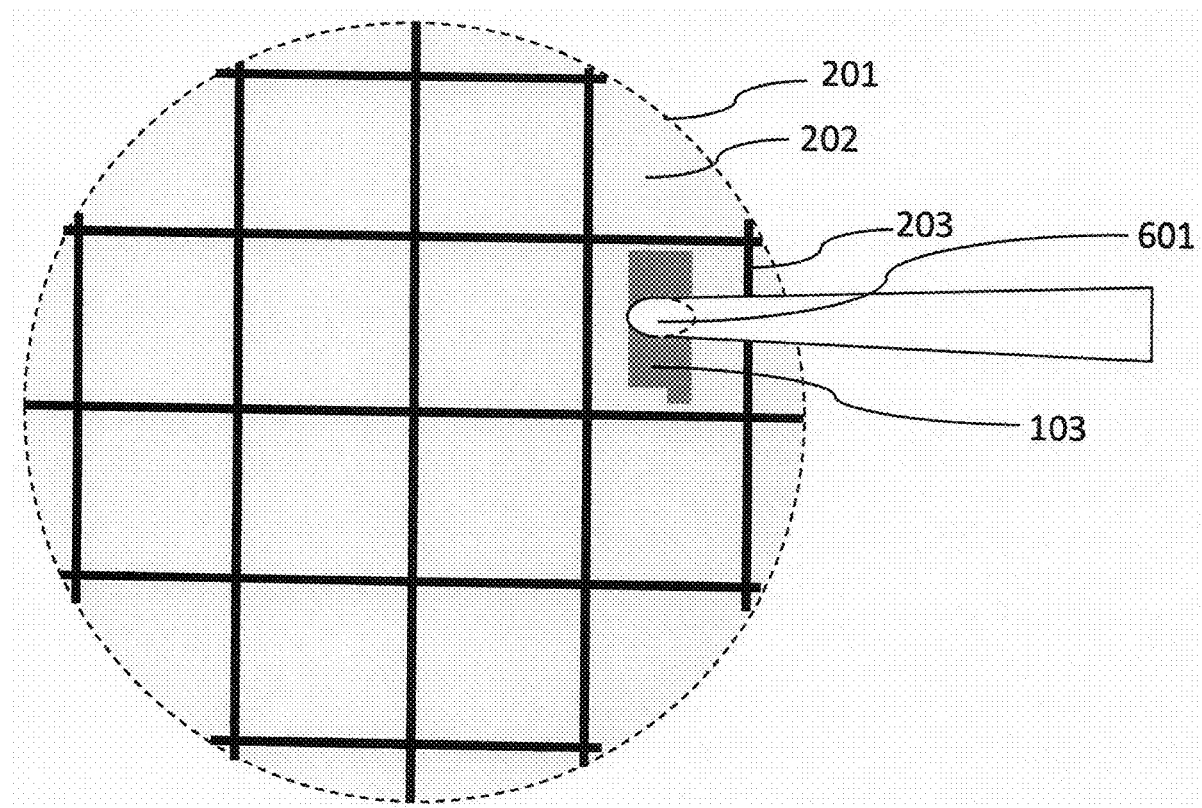

In FIG. 8c, the probe is pulled from the specimen 103 in an alternate fashion such that it releases from surface 601 and comes to rest on 202 as in the sequence shown by the arrows 622, 623, showing the steps of the process. FIG. 8d shows the resulting manipulation of elliptical probe 601 using the steps outlined in FIG. 8b, while FIG. 8e shows the resulting manipulation of elliptical probe 601 using the steps outlined in FIG. 8c. If both the tilt angle T and B in FIG. 6a was predefined at 45 degrees, and the probe is rotated by 180 degrees after lift out via the elliptical beveled surface 601 as per FIG. 7a, then the specimen surface 103 will be parallel to the carbon-coated grid surface 102 as per FIG. 8f and can be manipulated directly the grid in this manner.

Figure 8G:
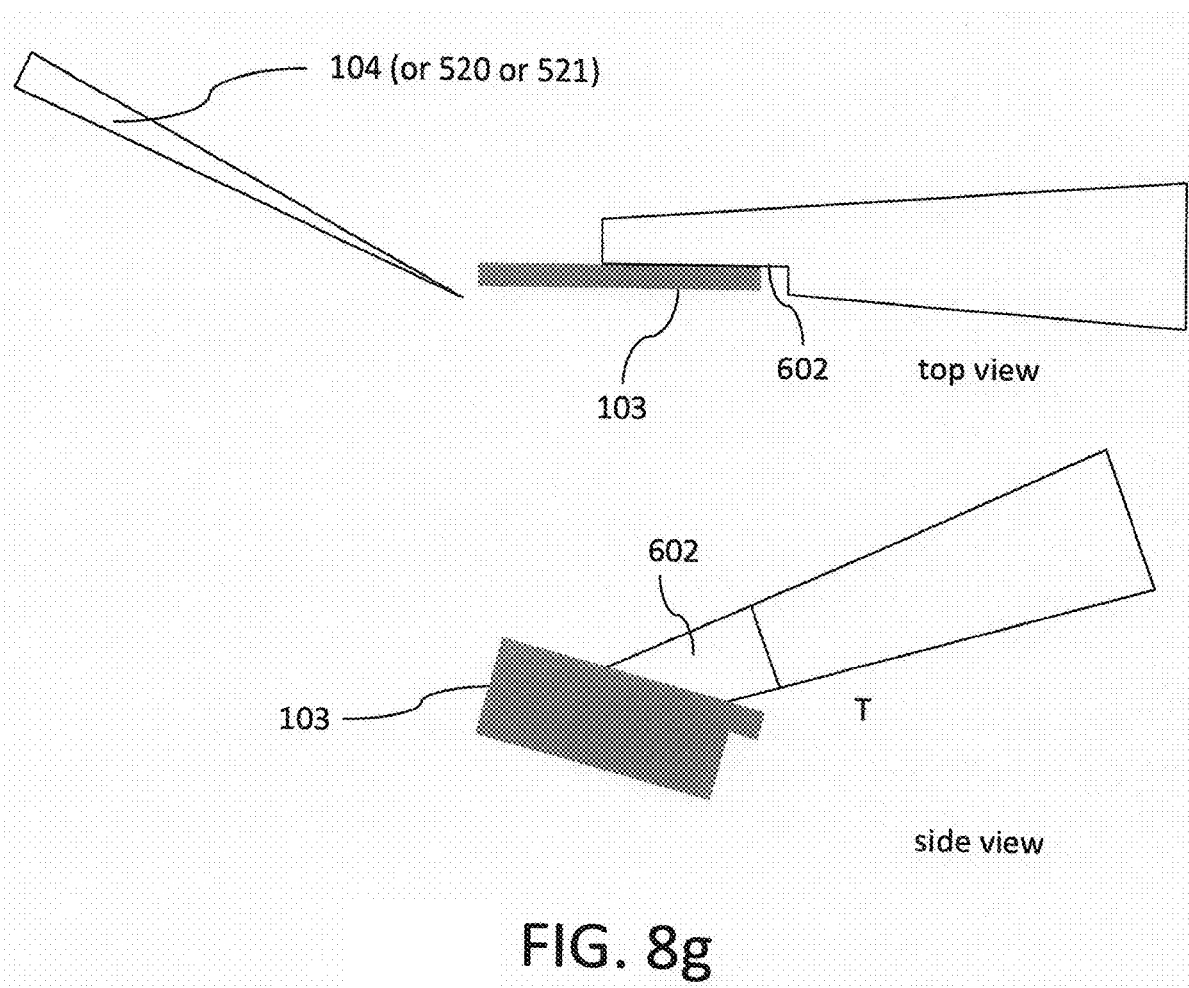
Figure 8H:
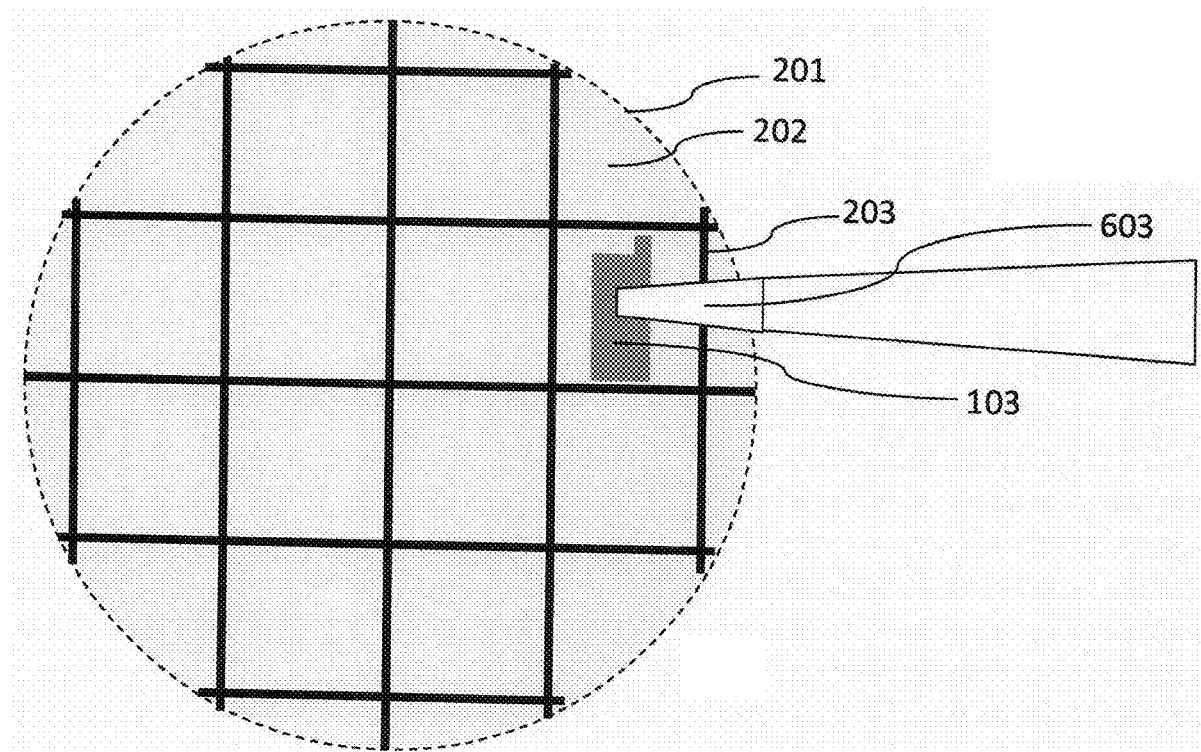

If either polygonal beveled surface 602 (or 603) is used to lift out the specimen as per geometry in FIG. 7b or FIG. 7c, the probe can be raised safely above the sample surface 101. If the specimen 103 is slightly rotated with respect to the probe as shown in FIG. 8g, a second stationary probe 104 (or 520/521) or probe mounted on a second manipulator may be used to nudge or rotate to optimize its position relative to the probe. Then the probe can be rotated by 90 degrees and the specimen can be manipulated to a carbon-coated grid surface 202 as per FIG. 8h.

Figure 9A:
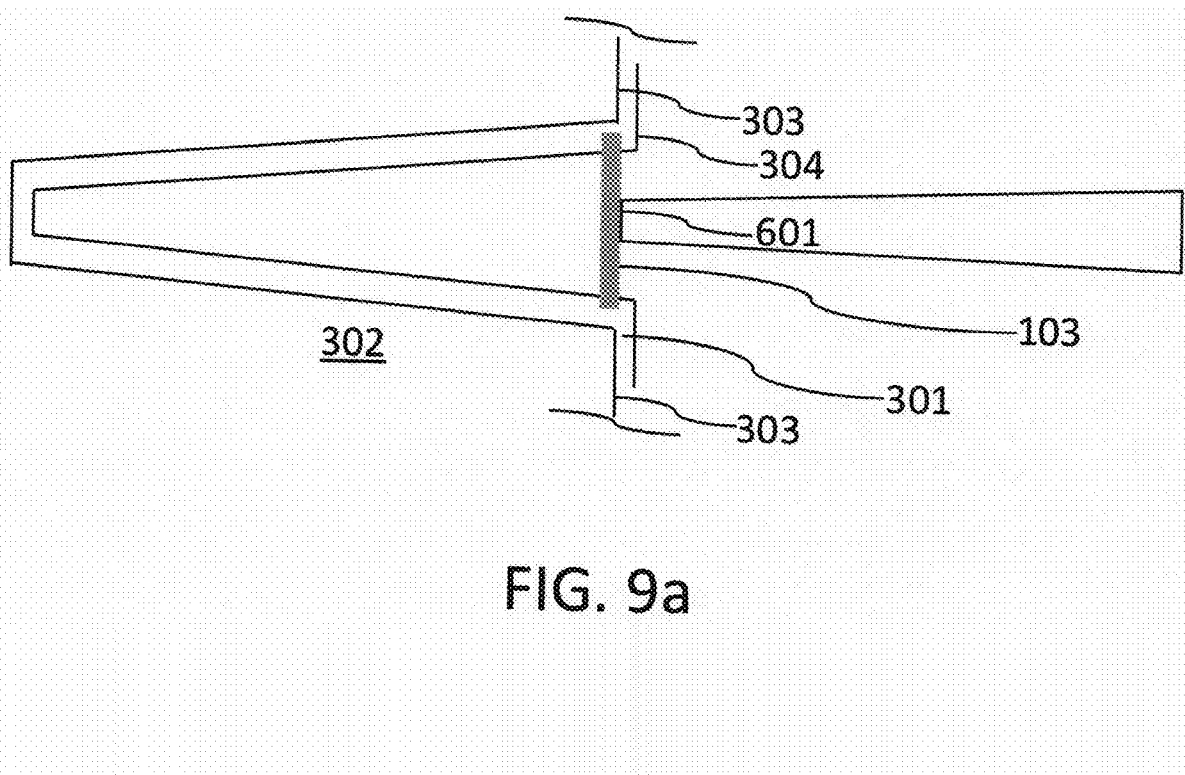
FIGS. 9a to 9d are schematic diagrams showing specimen manipulation using a beveled solid probe tip with an elliptical probe flat surface as in FIG. 6a after lift out as in FIG. 7a to a slotted EXpressLO slotted grid.
Figure 9B:
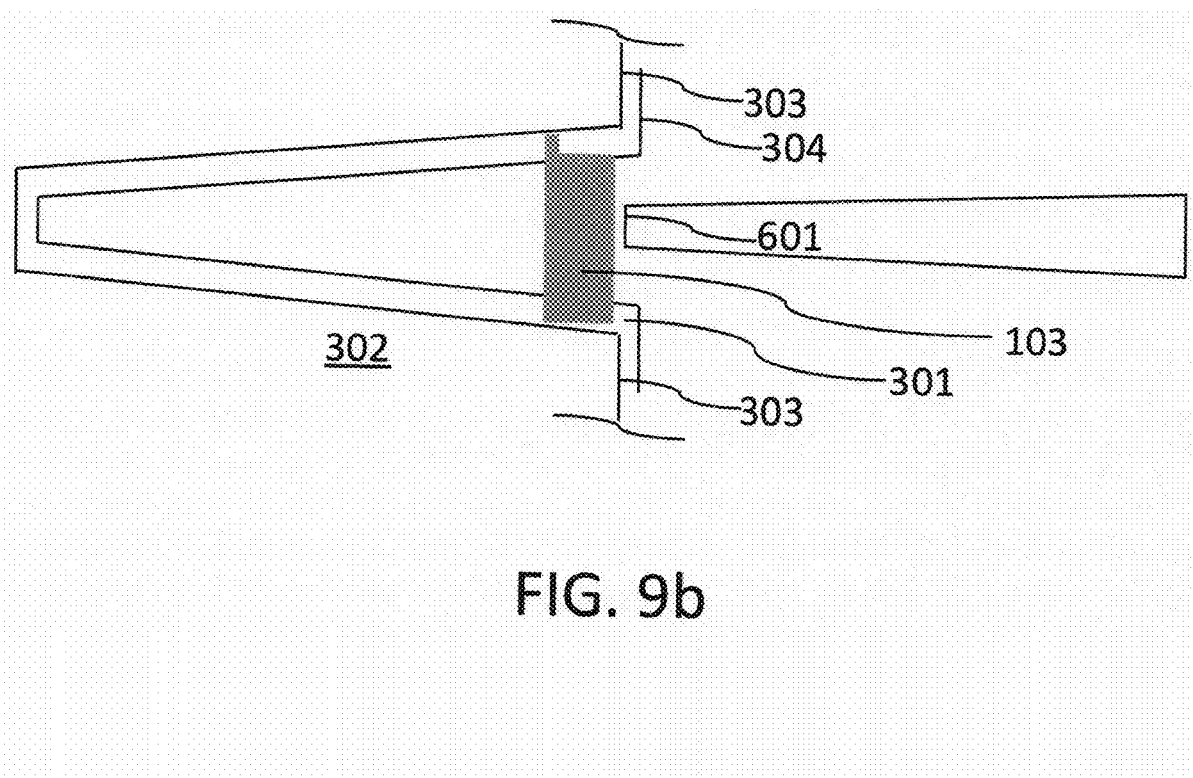
Figure 9C:
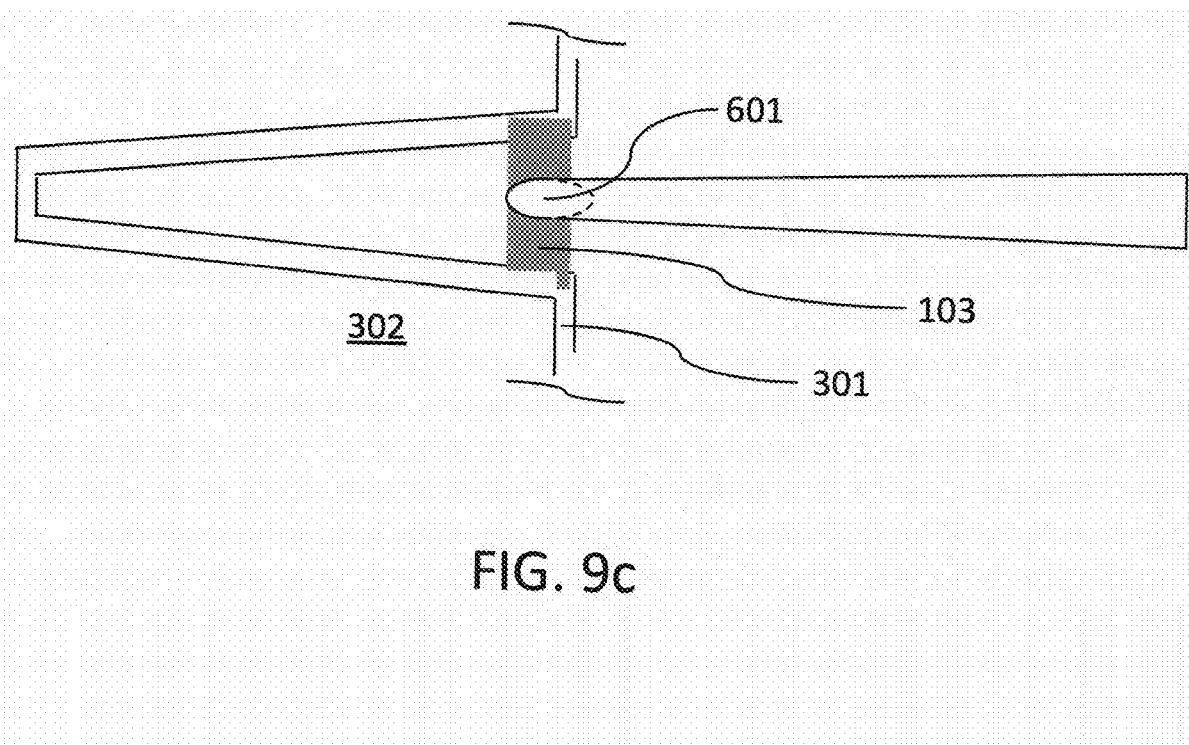
Figure 9D:
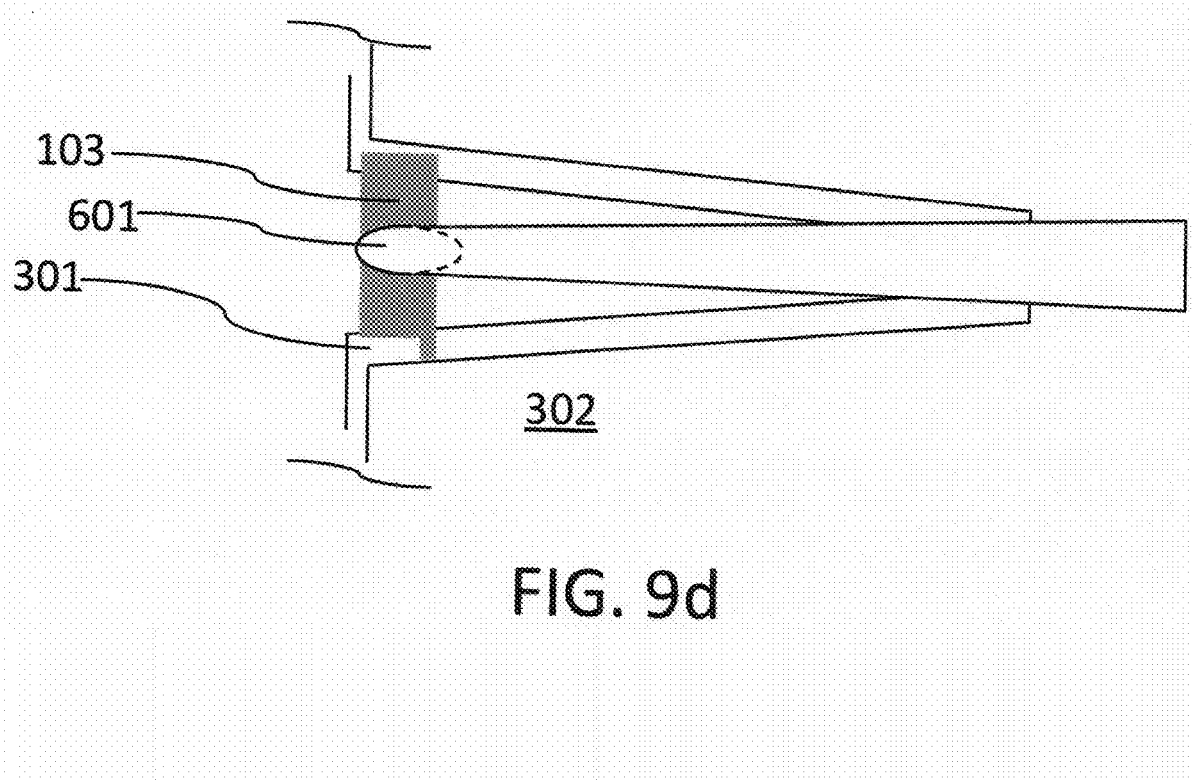

Lift outs with beveled surfaces can also be manipulated to EXpressLO grids. After lift out with the elliptical surface 601 as per FIG. 7a, the specimen position can be optimized as previously described by FIG. 8a above. Alternatively, the slotted EXpressLO grid edges 303 or 304 or surface 301 can be used to rotate or nudge the specimen as in FIG. 9a so that, as the probe is lowered, the specimen 103 will come to rest on the EXpressLO slotted support surface 301 as per FIG. 9b. Allowing the specimen 103 to rest in this orientation shown in FIG. 9b provides for the so-called backside orientation which is necessary to reduce curtaining by further FIB milling. Lift out, specimen optimization, and 90 degree probe rotation as described above can also allow for direct manipulation of specimen 103 onto the EXpressLO grid surface 301 as per FIG. 9c. By rotating the EXpressLO grid relative to the probe prior to manipulation as per FIG. 9d, and then performing specimen optimization, and 90 degree probe rotation as described above, the specimen 103 can be manipulated into the advantageous backside configuration.

Figure 10A:
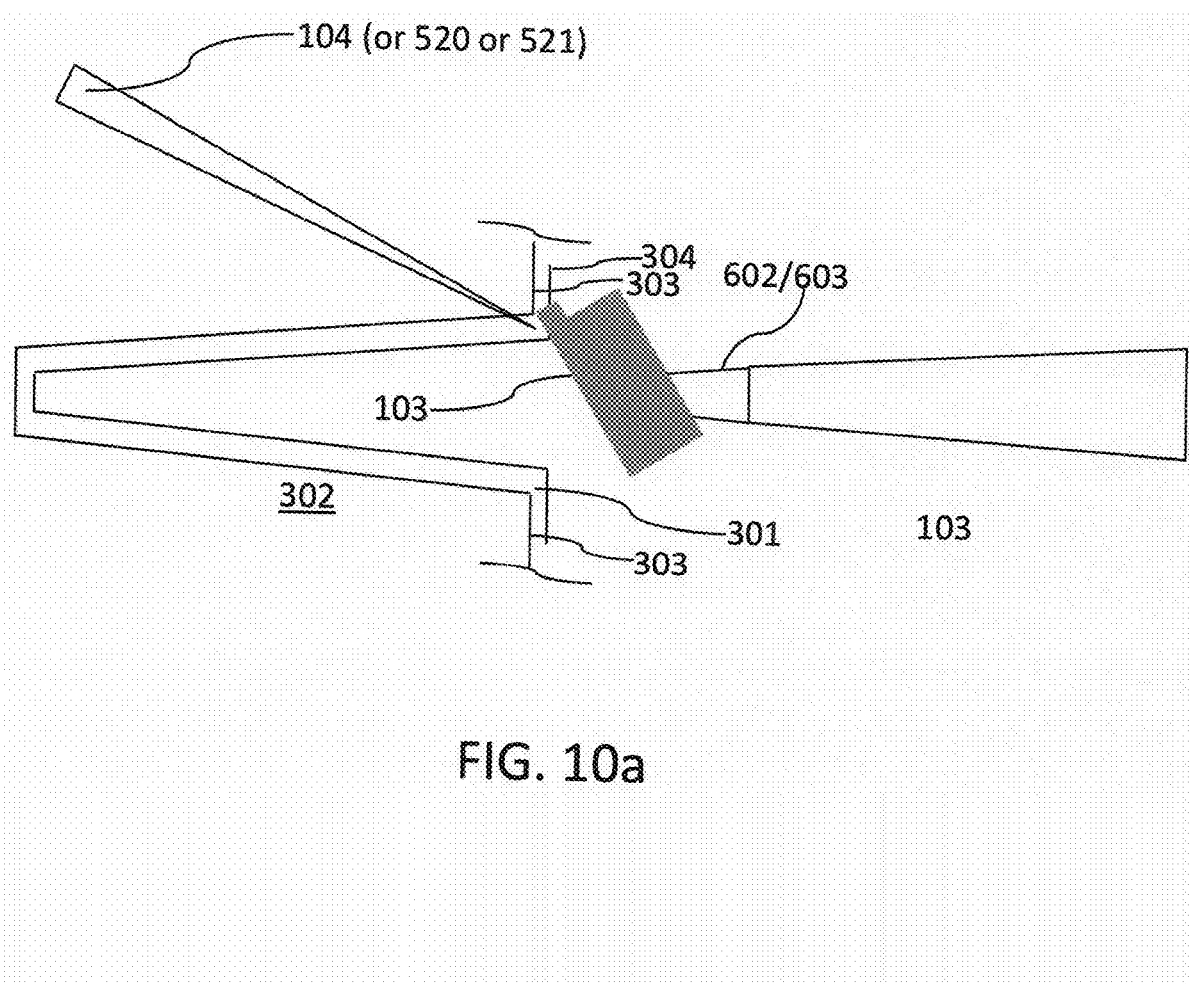
FIGS. 10a to 10c are schematic diagrams showing specimen manipulation using a beveled solid polygonal probe tip as in FIG. 6b or FIG. 6c and lift out procedures FIG. 7b and FIG. 7c to an EXpressLO slotted grid.
Figure 10B:
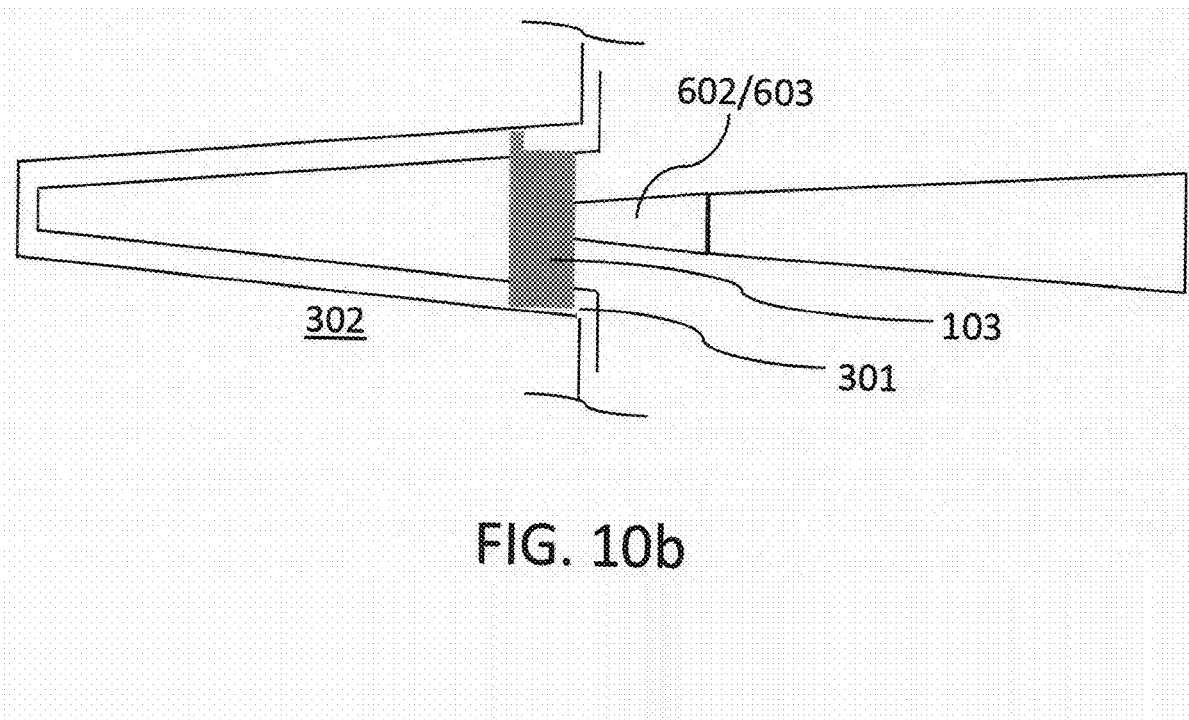
Figure 10C:
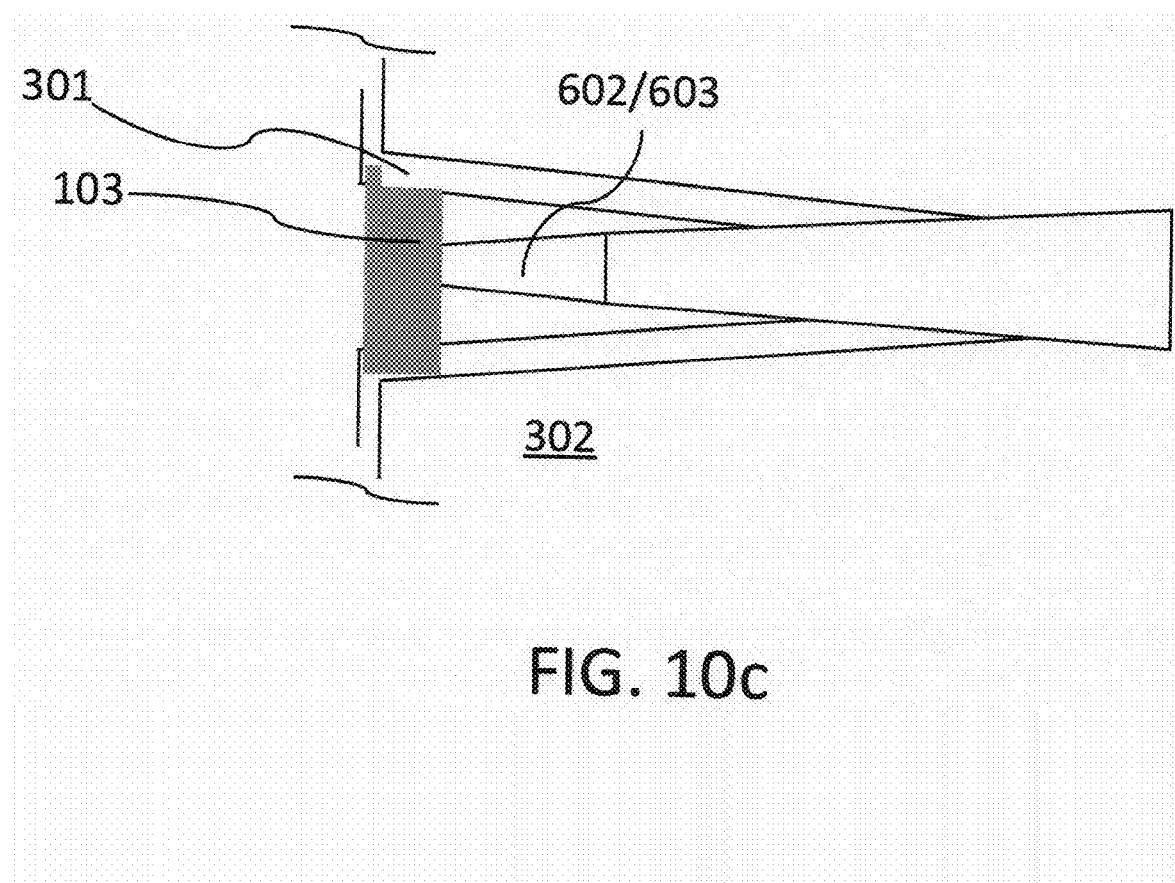

After lift out using the geometry shown in FIG. 7b or FIG. 7c, the probe may be rotated to about 90 degrees as per FIG. 10a and the specimen may be nudged or rotated about the probe with either a fixed secondary probe 104 (or 520/521), secondary probe 104 (or 520/521) in a second micromanipulator or via the EXpressLO grid edge 303, 304, or surface 301. Once the specimen position is optimized, the probe can be manipulated through the open slot defined by the EXpressLO grid, allowing specimen 103 to come to rest on surface 301 as per FIG. 10b. Alternatively, the EXpressLO grid carrier may be rotated ~180 degrees prior to manipulating the probe through the slot as in FIG. 10b.

Figure 11:
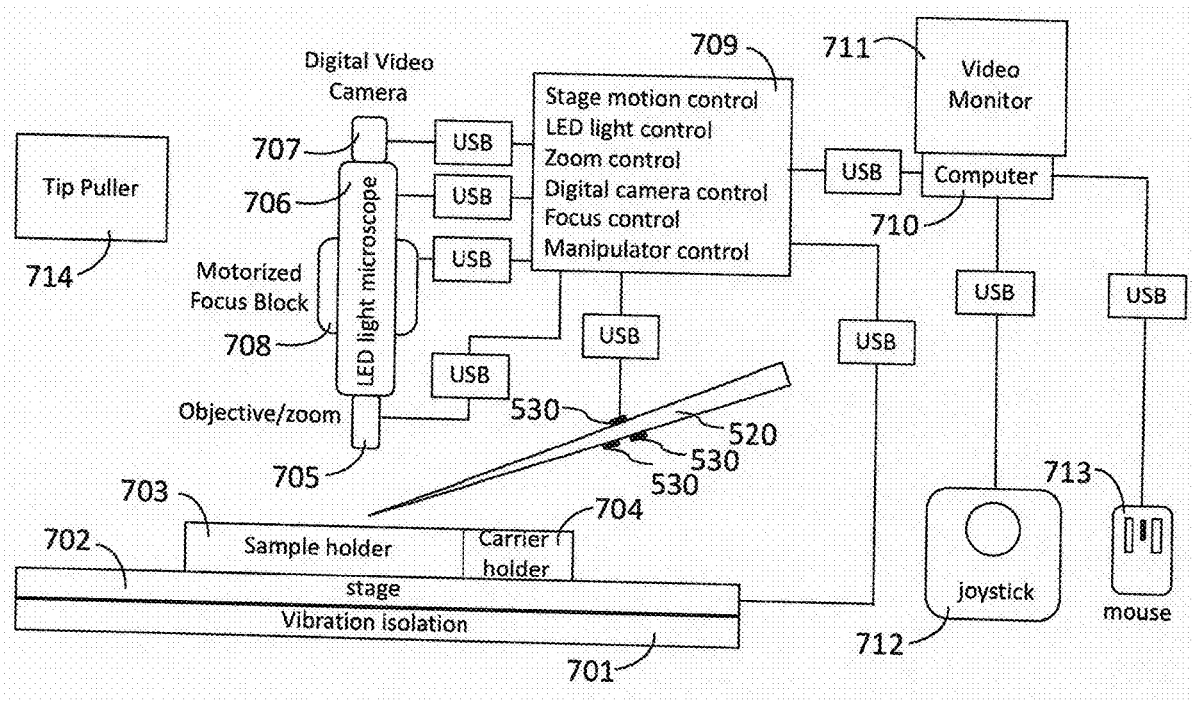
FIG. 11 is a schematic diagram of a lift out system implemented according to an aspect of the invention.

FIG. 11 is a schematic diagram of the computerized and motorized lift out system, including the manipulator probe holder previously described in FIG. 5c showing the holder 530 and the probe 520, with the vibration isolation table 701, the stage 702, sample holder 703, and carrier holder 704 (i.e., grid holder), objective and zoom part of the light optical microscope 705, light optical microscope with light emitting diode (LED) light source 706, digital video camera for visualization and saving video and still images 707, the motorized focus block 708, the controller box 709, the computer 710 and computer video monitor 711, the programmable joystick 712, the mouse 713, and the tip puller 714.

Various methods are now described for creating the beveled surface on the probe and adding a metalized surface to the probe tip. The beveled surfaces can be prepared by using focused ion beam milling, broad ion beam milling, laser ablation, or mechanical polishing a conical probe. Instead of removing material to create the bevel, material can also be added to create a beveled solid surface using 3D printing or additive manufacturing. If a conductive probe is needed, a metal probe can be used or a glass probe can be metalized by sputter coating with a conductive metal layer or by dipping, coating, or painting the probe with permanent ink (e.g., conductive particles in a solvent). While the direct usage of a metal tip is certainly possible, we found that a metallized glass probe tip can flex without breaking, while a metal tip pulled to this fine probe size can deform, destroying the tip geometry, and thus rendering the tip useless.

Having described and illustrated the principles of the invention in a preferred embodiment thereof, it should be apparent that the invention can be modified in arrangement and detail without departing from such principles. Other materials and processes may be used. I claim all modifications and variation coming within the spirit and scope of the following claims.

What is claimed is:

1. A method for lift out of a specimen milled upright within a trench of bulk material where the specimen is of a type having specimen edges under attractive force from adjacent trench edges of the trench, the method comprising:
   providing a solid probe having a first planar surface formed at or adjacent a probe tip thereof, said first planar surface having a non-zero planar angle relative to a normal to a long axis of the probe, wherein the first planar surface has a greater surface area than a surface area of the specimen edges under attractive force from adjacent trench edges of the trench;
   positioning the long axis of the probe at a tilt angle between the long axis and a normal to a face of the specimen, wherein the tilt angle and planar angle are approximately equal;
   abutting the first planar surface against a face of the specimen within the trench such that Van der Waals forces between the first planar surface and the face of the specimen is substantially greater than the attractive force between the specimen edges and the adjacent trench edges; and
   lifting the specimen out from the trench with the probe.

2. The method of claim 1, wherein the probe has a circular cross-section and the first planar surface is a beveled surface formed along a front facing solid tip of the probe such that the first planar surface of the solid tip forms an ellipse.

3. The method of claim 2, wherein the tilt angle is between 10 and 45 degrees.

4. The method of claim 2, wherein the ellipse has a long diameter of between about 25-75% of a depth of the specimen face.

5. The method of claim 1, wherein the first planar surface is formed parallel with the long axis of the probe.

6. The method of claim 5, wherein the probe has a second planar surface parallel with and spaced from the first planar surface.

7. The method of claim 5, wherein the first planar surface has a rectangular or slightly trapezoidal shape.

8. The method of claim 1, further including and after the step of lifting the specimen out from the trench with the probe:

manipulating the specimen to an open slot of a mounting grid; and placing side portions of the face of the specimen onto a recessed shelf within the open slot.

9. The method of claim 8, further including the step of rotating the probe about its long axis by 180 degrees prior to placing side portions of the face of the specimen onto the recessed shelf.

10. The method of claim 8, wherein the step of manipulating the specimen includes using a second probe to reorient the specimen on the first planar surface.

11. The method of claim 8, further including one or more steps taken from the group consisting of:

rotating the probe such that the specimen is generally underneath the probe for manipulating the specimen to a solid surface such as a carbon-coated grid or slotted carrier grid;

rotating the probe such that the specimen is generally on top of the probe for manipulating the specimen to a carrier grid so the specimen will come to rest on the grid support regions once the probe is lowered through the slot;

nudging and centering or optimizing specimen position on the first planar surface using a second stationary probe, a second probe attached to a micromanipulator, or the specimen carrier itself;

altering a probe tip tilt angle to optimize specimen position for manipulation; and/or rotating the specimen or a grid carrier relative to the probe.

12. The method of claim 1, wherein the step of providing a solid probe includes forming the first planar surface by a process consisting of one or more methods taken from mechanical polishing, FIB milling, broad ion milling, laser ablation or milling, and/or via additive manufacturing such as via 3D printing or deposition methods.

13. The method of claim 1, wherein the step of providing a solid probe includes providing a conductive surface to the first planar surface by applying a conductive coating.

14. A probe used to lift out a specimen from within a trench prepared from bulk material of a sample, the probe comprising:

a solid elongate body disposed along a long axis of the probe and terminating in a probe tip; and a solid planar surface adjacent an end of the probe tip formed at a non-zero angle relative to a normal to the long axis of the probe, wherein the solid planar surface includes a first solid planar surface parallel with the long axis of the probe and second planar surface spaced from and parallel with the first solid planar surface, wherein the solid planar surface is configured to impart sufficient Van der Waals attractive force to a sample surface positioned immediately adjacent the solid surface of the probe so that the sample can be detached from and lifted from the bulk material and transported to a grid for investigation.

15. The probe of claim 14, wherein the first solid planar surface and second solid planar surface have a rectangular or slightly trapezoidal shape.

16. The probe of claim 14, further including a metallized coating formed atop the solid planar surface.

* * * * *